US010103345B2

(12) United States Patent
Yoon et al.

(10) Patent No.: US 10,103,345 B2
(45) Date of Patent: Oct. 16, 2018

(54) QUANTUM DOT LIGHT-EMITTING DIODE AND LIGHT-EMITTING DISPLAY DEVICE USING THE DIODE

(71) Applicant: LG Display Co., Ltd., Seoul (KR)

(72) Inventors: Kyung-Jin Yoon, Goyang-si (KR); Na-Yeon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/810,688

(22) Filed: Nov. 13, 2017

(65) Prior Publication Data
US 2018/0138434 A1 May 17, 2018

(30) Foreign Application Priority Data

Nov. 15, 2016 (KR) ........................ 10-2016-0151989

(51) Int. Cl.
| | |
|---|---|
| *H01L 29/08* | (2006.01) |
| *H01L 51/50* | (2006.01) |
| *H01L 29/66* | (2006.01) |
| *H01L 33/06* | (2010.01) |
| *B82Y 40/00* | (2011.01) |

(52) U.S. Cl.
CPC ........ *H01L 51/502* (2013.01); *H01L 29/6609* (2013.01); *H01L 33/06* (2013.01); *B82Y 40/00* (2013.01)

(58) Field of Classification Search
CPC .... H01L 51/502; H01L 29/6609; H01L 33/06
USPC ..................................... 257/40, 98
See application file for complete search history.

(56) References Cited

U.S. PATENT DOCUMENTS

2004/0124766 A1*  7/2004  Nakagawa .......... H01L 51/0064
                                                      313/504

OTHER PUBLICATIONS

Kwak et al., "Bright and Efficient Full-Color Colloidal Quantum Dot Light-Emitting Diodes Using an Inverted Device Structure", NANO Letters 2012, American Chemical Society, 12, pp. 2362-2366.

* cited by examiner

*Primary Examiner* — Tan N Tran
(74) *Attorney, Agent, or Firm* — Morgan, Lewis & Bockius LLP

(57) ABSTRACT

Provided are a quantum dot light-emitting diode including an interface control layer located between a luminous material layer using quantum dots as a luminous material and at least one charge transfer layer for supplying charges to the luminous material layer, and a quantum dot light-emitting display device including the same. Since the interface control layer is provided between the luminous material layer and the at least one charge transfer layer, the occurrence of an interface defect due to an interfacial energy mismatch between the luminous material layer and the at least one charge transfer layer may be prevented to obtain the luminous material layer including quantum dots with uniform morphology. Furthermore, since the interface control layer is used, oxygen or moisture may be prevented from permeating into the luminous material layer, thereby preventing degradation of the quantum dots used as a luminous material.

10 Claims, 7 Drawing Sheets

QUANTUM DOT LIGHT-EMITTING DIODE AND LIGHT-EMITTING DISPLAY DEVICE USING THE DIODE

CROSS-REFERENCE TO RELATED APPLICATIONS

This application claims the benefit under 35 U.S.C. § 119(a) of Korean Patent Application No. 10-2016-0151989, filed on Nov. 15, 2016, in the Korean Intellectual Property Office, which is incorporated herein by reference in its entirety.

BACKGROUND

1. Technical Field

The present disclosure relates to a light-emitting diode, and more particularly, to a quantum dot light-emitting diode having improved luminous characteristics such as luminous efficiency, and a light-emitting display device using the same.

2. Discussion of the Related Art

Next-generation light-emitting diode display devices capable of replacing a liquid crystal display (LCD) device which is a representative example of a flat panel display device have rapidly come into use. Among the next-generation light-emitting diode display devices, an organic light-emitting diode (OLED) display device uses an organic material as a material of an emissive layer. When a current density of a light-emitting diode or a driving voltage is increased to increase the brightness of light emitted in the OLED display device, the lifetime of the light-emitting diode may be reduced due to degradation of an organic luminous material, e.g., decomposition of the organic luminous material.

Much attention has been paid to a quantum dot light-emitting diode (QLED) using quantum dots (QDs) as a material of an emissive layer, as an alternative to an OLED. An emission peak may be easily controlled by adjusting the size of the quantum dots, and the quantum dots are more robust to material degradation, oxidation, etc., caused by heat or moisture, than an organic material. Similar to the OLED, the quantum dot light-emitting diode generally has a multilayer structure including an additional layer between an emissive layer and an electrode to transport electric charge carriers such as holes or electrons. Quantum dots used in the emissive layer is an inorganic material, whereas a charge transport layer, and particularly, a hole transport layer is formed of an organic material. Since the charge transport layer formed of the organic material is stacked near the emissive layer formed of the quantum dots, a defect may occur at an interface between the emissive layer and the charge transport layer.

For example, when the hole transport layer is formed by spin-coating an organic material and the emissive layer formed of quantum dots is formed by performing spin coating on the hole transport layer, it may be difficult to achieve uniform surface morphology of the quantum dot emissive layer due to an interfacial energy mismatch occurring at an interface between the organic material of the hole transport layer and the quantum dots which are inorganic materials of the emissive layer. When an electron transport layer formed of an organic material is stacked on the quantum dot emissive layer with insufficient morphology as described above, the electron transport layer may be formed in a form of the morphology of the quantum dot emissive layer with collapsed morphology. In this case, even if an electrode which is finally formed is stacked to a great thickness, the electrode is deposited in the form of the collapsed morphology of the quantum dot emissive layer.

As described above, in a QLED, the morphology of an emissive layer formed of quantum dots cannot be secured due to cohesion of the quantum dots, caused by an interfacial energy mismatch between the quantum dots which are inorganic materials used as a material of the emissive layer and an organic material of charge transport layers located on and below the emissive layer, during the performance of coating on the emissive layer and removal of a solvent from the emissive layer. When the uniform morphology of the emissive layer formed of quantum dots is not secured, light emission does not occur uniformly in the QLED and overall luminous efficiency is greatly lowered.

Furthermore, quantum dots used to form an emissive layer of a QLED device are vulnerable to moisture or oxygen and are thus degraded when moisture or oxygen permeates a QLED. Luminous efficiency and the stability of a light-emitting diode are reduced due to a defect occurring at an interface between the emissive layer including the quantum dots and a charge transport layer adjacent to the emissive layer, non-uniform morphology characteristics of the quantum dots, degradation of the quantum dots caused by permeation of moisture or oxygen, or the like.

SUMMARY

Accordingly, embodiments of the present disclosure are directed to a quantum dot light-emitting diode and a light-emitting display device using the diode that substantially obviate one or more of the problems due to limitations and disadvantages of the related art.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structures particularly pointed out in the written description and claims as well as the appended drawings.

One or more embodiments relate to a quantum dot light-emitting diode including an interface control layer between a luminous material layer and a charge transfer layer to prevent an interface defect from occurring at an interface between the luminous material layer and the charge transfer layer.

The interface control layer may be located between the luminous material layer and a first charge transfer layer and/or between the luminous material layer and a second charge transfer layer.

One or more embodiments relate to a quantum dot light-emitting display device employing the quantum dot light-emitting diode as a light-emitting device.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
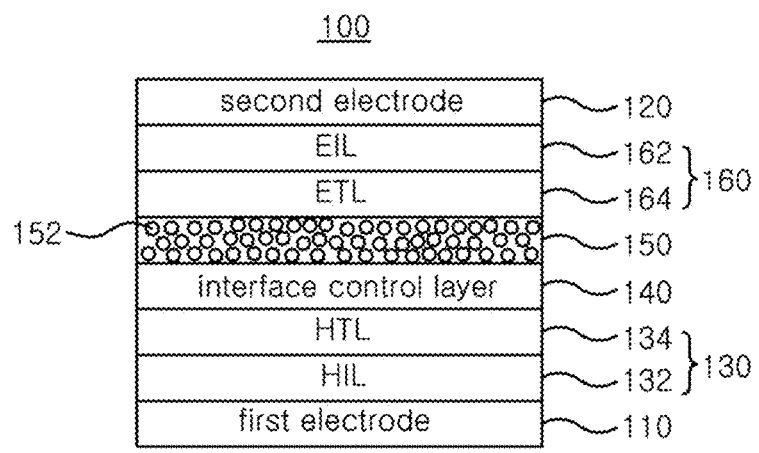
FIG. 1 is a schematic cross-sectional view of a quantum dot light-emitting diode having a normal structure, in which an interface control layer is located between a luminous material layer and a first charge transfer layer, according to a first embodiment of the present disclosure.

Reference will now be made in detail to embodiments of the present disclosure, examples of which are illustrated in the accompanying drawings. In the following description, when a detailed description of well-known functions or configurations related to this document is determined to unnecessarily obscure the gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following description are selected only for the sake of convenience in writing the specification and thus may be different from those used in actual products.

According to the present disclosure, in a quantum dot light-emitting diode, an interface control layer is formed between a luminous material layer and a charge transfer layer. The present disclosure is based on the facts that morphology characteristics of the luminous material layer may be prevented from being degraded due to an interface defect occurring at an interface between the luminous material layer and the charge transfer layer, caused when the luminous material layer and the charge transfer layer are in direct contact with each other, and quantum dots which are a luminous material may be prevented from being degraded or oxidized due to permeation of moisture or oxygen into the luminous material layer. Hereinafter, the present disclosure will be described in more detail with reference to the accompanying drawings when necessary.

FIG. 1 is a schematic cross-sectional view of a quantum dot light-emitting diode having a normal structure, in which an interface control layer is located between a luminous material layer and a first charge transfer layer, according to a first embodiment of the present disclosure. As illustrated in FIG. 1, a quantum dot light-emitting diode 100 according to the first embodiment of the present disclosure includes a first electrode 110, a second electrode 120 facing the first electrode, a luminous material layer 150 located between the first electrode 110 and the second electrode 120, a first charge transfer layer 130 located between the first electrode 110 and the luminous material layer 150, and a second charge transfer layer 160 located between the luminous material layer 150 and the second electrode 120.

In the present embodiment, the first electrode 110 may be an anode, similar to a hole injection electrode. The first electrode 110 may be formed on a substrate (not shown in FIG. 1) which may be formed of glass or a polymer. For example, the first electrode 110 may be a doped or undoped metal oxide, such as an indium-tin oxide (ITO), an indium-zinc oxide (IZO), an indium-tin-zinc oxide (ITZO), an indium-copper oxide (ICO), a tin oxide ($SnO_2$), an indium oxide ($In_2O_3$), a cadmium:zinc oxide (Cd:ZnO), a fluorine:tin oxide (F:$SnO_2$), an indium:tin oxide (In:$SnO_2$), a gallium:tin oxide (Ga:$SnO_2$), or an aluminum:zinc oxide (Al:ZnO (AZO)). Selectively, the first electrode 110 may include a metal material such as nickel (Ni), platinum (Pt), gold (Au), silver (Ag), iridium (Ir), or carbon nanotubes, as well as the metal oxide described above.

In the present embodiment, the second electrode 120 may be a cathode, similar to an electron injection electrode. For example, the second electrode 120 may include Ca, Ba, Ca/Al, LiF/Ca, LiF/Al, $BaF_2$/Al, CsF/Al, $CaCO_3$/Al, $BaF_2$/Ca/Al, Al, Mg, Au:Mg, or Ag:Mg. For example, the first electrode 110 and the second electrode 120 may be stacked to a thickness of 50 to 300 nm.

In one embodiment, when the light-emitting diode 100 is a bottom emission type light-emitting diode, the first electrode 110 may include a transparent conductive metal such as ITO, IZO, ITZO, or AZO, and the second electrode 120 may include Ca, Ba, Ca/Al, LiF/Ca, LiF/Al, $BaF_2$/Al, Al, Mg, an Ag:Mg alloy, or the like.

The first charge transfer layer 130 is located between the first electrode 110 and the luminous material layer 150. In the present embodiment, the first charge transfer layer 130 may be a hole transfer layer which supplies holes to the luminous material layer 150. For example, the first charge transfer layer 130 may include a hole injection layer (HIL) 132 located between the first electrode 110 and the luminous material layer 150 and adjacent to the first electrode 110, and a hole transport layer (HTL) 134 located between the first electrode 110 and the luminous material layer 150 and adjacent to the luminous material layer 150.

The HIL 132 facilitates the injection of holes from the first electrode 110 to the luminous material layer 150. In one embodiment, the HIL 132 may include an organic material selected from the group consisting of poly(ethylene dioxythiophene):polystyrene sulfonate (PEDOT:PSS), 4,4',4"-tris (diphenylamino)triphenylamine (TDATA) doped with tetrafluoro-tetracyano-quinodimethane (F4-TCNQ), e.g., p-doped phthalocyanine such as zinc phthalocyanine (ZnPc) doped with F4-TCNQ or N,N'-diphenyl-N,N'-bis(1-naphtyl)-1,1'-biphenyl-4,4"-diamine (α-NPD) doped with F4-TCNQ, hexaazatriphenylene-hexanitrile (HAT-CN), and a combination thereof, but the present disclosure is not limited thereto. For example, a dopant usable in the HIL 132, such as F4-TCNQ, may be doped at a ratio of 1 to 20 wt % with respect to the total weight of a hole injection host.

The HTL 134 transports holes from the first electrode 110 to the luminous material layer 150. The HTL 134 may include an organic material. For example, the HTL 134 may be formed of an organic material selected from the group consisting of 4,4'-N,N'-dicarbazolyl-biphenyl (CBP), aryl amines such as N,N'-diphenyl-N,N'-bis(1-naphtyl)-1,1'-biphenyl-4,4"-diamine (α-NPD, α-NPB), Spiro-NPB, N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino) phenyl)-N,N'-diphenylbenzidine (DNTPD), 4,4',4"-tris(N-carbazolyl)-triphenylamine (TCTA), tris(3-methylphenylphenylamino)-triphenylamine (m-MTDATA), poly(9,9'-dioctylfluorene-co-N-(4-butylphenyl)diphenylamine (TFB), and poly(9-vinylcarbazole) (PVK), polyaniline, polypyrrole, copper phthalocyanine, 4,4'-bis(p-carbazolyl)-1,1'-biphenyl, N,N,N',N'-tetraarylbenzidine, PEDOT:PSS and derivatives thereof, poly-N-vinylcarbazole and derivatives thereof, a poly(para)phenylenevinylene such as poly [2-methoxy-5-(2-ethylhexyloxy)-1,4-phenylenevinylene] (MEH-PPV) or poly[2-methoxy-5-(3',7"dimethyloctyloxy)-1,4-phenylenevinylene] (MOMO-PPV) and derivatives thereof, polymethacrylate and derivatives thereof, poly(9,9-octylfluorene) and derivatives thereof, poly(spiro-fluorene) and derivatives thereof, and a combination thereof.

In the drawings, although the first charge transfer layer 130 is divided into the HIL 132 and the HTL 134, the first charge transfer layer 130 may include one layer. For example, the HIL 132 may be omitted, and the first charge transfer layer 130 may include only the HTL 134. The first charge transfer layer 130 may be formed by doping a hole transport organic material as described above with a hole injection material (e.g., PEDOT:PSS).

The first charge transfer layer 130 including the HIL 132 and the HTL 134 may be formed using vacuum deposition such as vacuum vapor deposition or sputtering, spin coating, drop coating, dip coating, spray coating, roll coating, flow coating, a solution process such as a casting process, screen printing or inkjet printing, or a combination thereof. For example, the HIL 132 and the HTL 134 may each have a thickness of 10 nm to 200 nm, and preferably, a thickness of 10 nm to 100 nm, but the present disclosure is not limited thereto.

The luminous material layer 150 may be a layer filled with, for example, quantum dots 152 having an average diameter of 1 nm to 100 nm. For example, the luminous material layer 150 may be formed by coating the quantum dots 152 onto the interface control layer 140 through a solution process of coating a dispersion solution containing the quantum dots 152 in a solvent and then volatilizing the solvent. The luminous material layer 150 may be stacked using spin coating, drop coating, dip coating, spray coating, roll coating, flow coating, a solution process such as a casting process, screen printing or inkjet printing, or a combination thereof.

The quantum dots 152 used in the luminous material layer 150 may be semiconductor nanocrystals having a quantum confine effect. The quantum dots 152 may include a Group II-VI nano-semiconductor compound, a Group nano-semiconductor compound, or a Group III-V nano-semiconductor compound. For example, the quantum dots 152 may be a Cd-free Group or Group III-V semiconductor compound. The quantum dots 152 may have a single structure or a core/shell structure.

For example, the quantum dots 152 have a core-shell structure in which a luminous core component is located at a center and a surface of the luminous core component is surrounded by a shell to protect the luminous core component. A surface of the shell is surrounded by a ligand component for dispersion in a solvent. In some cases, the ligand is a component which may be removed when the luminous material layer 150 is formed.

In detail, the quantum dots 152 may be Group II-VI compound semiconductor nanocrystals such as CdS, CdSe, CdTe, ZnS, ZnSe, ZnTe, HgS, HgTe, or a combination thereof; Group III-V or Group IV-VI compound semiconductor nanocrystals such as GaP, GaAs, GaSb, InP, InAs, or InSb; PbS, PbSe, PbTe, or a combination thereof; $CuInSe_2$ nanocrystals; metal oxide nanoparticles such as ZnO, $TiO_2$ or a combination thereof; or nanocrystals having a core-shell structure such as CdSe/ZnSe, CdSe/ZnS, CdS/ZnSe, CdS/ZnS, ZnSe/ZnS, InP/ZnS ZnO/MgO, or a combination thereof. The semiconductor nanoparticles may be doped with or undoped with a rare-earth element such as Eu, Er, Tb, Tm, or Dy or any combination of such rare-earth elements, or may be doped with a transition metal element such as Mn, Cu, or Ag or any combination of such transition metal elements.

Selectively, the quantum dots 152 may be alloy quantum dots (e.g., $CdS_xSe_{1-x}$, $CdSe_xTe_{1-x}$, or $Zn_xCd_{1-x}Se$) such as homogeneous alloy quantum dots or gradient alloy quantum dots. The quantum dots 152 may be generally synthesized by a wet process of placing a precursor material into an organic solvent and growing particles (e.g., colloid quantum dots). Light of various wavelengths may be obtained by controlling an energy band gap according to a degree of growth of the quantum dot 152 particles.

For example, white color may be realized by including the quantum dots 152 having 440 nm, 530 nm, or 620 nm PL emission characteristics in the luminous material layer 150. Selectively, the luminous material layer 150 may include the quantum dots 152 having a red, green, or blue color, and individually emit red, green, or blue light.

The second charge transfer layer 160 is located between the luminous material layer 150 and the second electrode 120. In the present embodiment, the second charge transfer layer 160 may be an electron transport layer supplying electrons to the luminous material layer 150. In one embodiment, the second charge transfer layer 160 may include an electron injection layer (EIL) 162 located between the second electrode 120 and the luminous material layer 150 and adjacent to the second electrode 120, and an electron transport layer (ETL) 164 located between the second electrode 120 and the luminous material layer 150 and adjacent to the luminous material layer 150.

The EIL 162 facilitates the injection of electrons from the second electrode 120 to the luminous material layer 150. For example, the EIL 162 may be formed of a metal, such as Al, Cd, Cs, Cu, Ga, Ge, In, or Li, which is doped with or bound to fluorine, or a metal oxide doped or undoped with Al, Mg, In, Li, Ga, Cd, Cs, Cu, or the like, e.g., titanium dioxide ($TiO_2$), zinc oxide (ZnO), zirconium oxide (ZrO), tin oxide ($SnO_2$), tungsten oxide ($WO_3$), or tantalum oxide ($Ta_2O_3$).

The ETL 164 transports electrons to the luminous material layer 150. The ETL 164 may be formed of an organic material. For example, the ETL 164 may include an oxazole-based compound, an isoxazole-based compound, a triazole-based compound, an isothiazole-based compound, an oxydiazole-based compound, a thiadiazole-based compound, a perylene-based compound, or an aluminum complex.

In detail, the organic material of the ETL 164 may be selected from the group consisting of 3-(biphenyl-4-yl)-5-(4-tertbutylphenyl)-4-phenyl-4H-1,2,4-triazole (TAZ), bathocuproine (2,9-dimethyl-4,7-diphenyl-1,10-phenanthroline (BCP)), 2,2′,2″-(1,3,5-Benzinetriyl)-tris(1-phenyl-1-H-benzimidazole) (TPBi), Tris(8-hydroxyquinoline)aluminum ($Alq_3$), bis(2-methyl-8-quinolinato)-4-phenylphenolate aluminum (III) (Balq), bis(2-methylquinolinato)(triphenylsiloxy) aluminum (III) (Salq), and a combination thereof, but the present disclosure is not limited thereto.

Although it is illustrated that the second charge transfer layer 160 includes two layers, i.e., the EIL 162 and the ETL 164, similar to the first charge transfer layer 130, but the second charge transfer layer 160 may include only the ETL 164.

The second charge transfer layer 160 including the EIL 162 and the ETL 164 may be formed using a vacuum deposition process such as vacuum vapor deposition or sputtering, spin coating, drop coating, dip coating, spray coating, roll coating, flow coating, or a solution process such as a casting process, screen printing, or inkjet printing, or a combination thereof.

For example, the EIL 162 and the ETL 164 may be each stacked to a thickness of 10 to 200 nm, and preferably, to a thickness of 10 to 100 nm.

According to the first embodiment of the present disclosure, the interface control layer 140 is located between the first charge transfer layer 130 and the luminous material layer 150. The interface control layer 140 improves surface morphology characteristics of the luminous material layer 150 and the quantum dots 152 located in the luminous material layer 150 and blocks permeation of moisture or oxygen into the luminous material layer 150.

The interface control layer 140 should prevent surface morphology characteristics of the quantum dots 152 and the luminous material layer 150 from being lowered due to an interface defect occurring between the quantum dots 152 which are inorganic materials constituting the luminous material layer 150 adjacent thereto and the first charge transfer layer 130 formed of an organic material. Thus, a material of the interface control layer 140 may be a material having high interfacial adhesion to the quantum dots 152 which are inorganic materials.

In one embodiment, the material of the interface control layer 140 is transparent, has a light transmissivity of 90% or more, and may be dried within several hours when heat or light such as ultraviolet (UV) rays is applied thereto. A non-restrictive example of the material of the interface control layer 140 may include a monomer or an oligomer with a silanol group and/or a siloxane group. In the present disclosure, the oligomer refers to a material in which a unit is repeated two to thirty times, and preferably, two to ten repeated units.

The monomer or the oligomer having a silanol group and/or a siloxane group may include a monomer or an oligomer which may be used to form a siloxane-based polymer to be described below. For example, the monomer or the oligomer having a silanol group and/or a siloxane group is a linear siloxane-based monomer or oligomer such as an alkylsiloxane or alkoxysiloxane in which a C1-C10 alkyl group and/or C1-C10 alkoxy group is substituted, e.g., tetramethyl orthosilicate (TMOS) or tetraethyl orthosilicate (TEOS), but the present disclosure is not limited thereto.

To form the interface control layer 140, a liquid composition containing the monomer having a silanol group and/or a siloxane group and an organic solvent is applied onto an appropriate base material, e.g., the first charge transfer layer 130, using spin coating, drop coating, dip coating, spray coating, roll coating, slit coating, flow coating, a solution process such as a casting process, screen printing, inkjet printing, knife jetting, or dispensing, or a combination thereof. Next, the interface control layer 140 formed of the monomer or the oligomer having a silanol group and/or a siloxane group may be stacked by removing the organic solvent by performing a heat drying process at 120° C. or less, for example, 50 to 120° C.

In another embodiment, the interface control layer 140 may be formed of a material which is transparent, has a light transmissivity of 90% or more, and may be cured to form cross-linking network structure when heat or light such as UV rays is applied thereto. Since the interface control layer 140 is formed of a material capable of forming a network structure, oxygen and/or moisture flowing into the quantum dot light-emitting diode 100 may be effectively prevented from permeating into the luminous material layer 150. In another embodiment, the interface control layer 140 may have a layered structure to increase a path of penetration of oxygen and/or moisture and thus may be formed of a material capable of delaying or blocking the permeation of the oxygen and/or moisture into the luminous material layer 150.

For example, when the interface control layer 140 includes a polymer, the interface control layer 140 may be formed of a material having high light transmissivity and capable of forming a network structure, the material being selected from the group consisting of a siloxane-based polymer, a silazane-based polymer, a nanoclay-polymer composite having a layered structure, and a combination thereof.

For example, when the interface control layer 140 is formed of a siloxane-based polymer, the type of siloxane monomer and/or siloxane oligomer serving as a reactive component of a main chain of the siloxane-based polymer is not particularly limited. In one embodiment, a photoreactive functional group moiety may be bound to or may not be bound to a side chain of the siloxane monomer and/or siloxane oligomer. An example of the siloxane monomer and/or siloxane oligomer may be a silanol monomer/oligomer or a siloxane monomer/oligomer with at least one of a silanol group and a siloxane group.

The silanol monomer/oligomer may be an ethylenically unsaturated alkoxy silane or ethylenically unsaturated acyloxy silane. Examples of the ethylenically unsaturated alkoxy silane compound may include an acrylate-based alkoxy silane (e.g., γ-acryloxypropyl-trimethoxysilane, γ-acryloxypropyl-triethoxysilane), a methacrylate-based alkoxysilane (e.g., γ-methacryloxypropyl-trimethoxysilane, γ-methacryloxypropyl-triethoxysilane). Examples of an ethylenically unsaturated aryloxysilane compound may include acrylate-based acetoxysilane, methacrylate-based acetoxysilane and ethylene-based unsaturated acetoxysilane (e.g., acrylatepropyl triacetoxy silane, methacrylatepropyl triacetoxysilane).

Alternatively, a monomer/oligomer with a siloxane group may also be used as siloxane monomer and/or siloxane oligomer to form a main chain of the siloxane-based polymer. Examples of the monomer/oligomer with a siloxane group may include a siloxane monomer/oligomer with a linear siloxane group, a cyclosiloxane-based monomer/oligomer, a tetrahedral siloxane-based monomer/oligomer, and a monomer/oligomer having a silsesquioxane structure.

Examples of a monomer/oligomer compound with a linear siloxane group may include an alkylsiloxane in which a C1-C10 alkyl group and/or a C1-C10 alkoxy group is substituted (e.g., tetramethyl orthosilicate (TMOS) or tetraethyl orthosilicate (TEOS)), alkoxysiloxanes, alkoxyalkylsiloxanes, vinylalkoxysiloxanes, 3-aminopropyltriethoxysilane, 3-glycidoxypropyltriethoxysilane, 3-glycidoxypropylmethyldimethoxysilane, 3-chloropropyl methyldimethoxysilane, 3-chloropropyl trimethoxysilane, 3-methacryloxypropyltrimethoxysilane, 3-mercaptopropyltrimethoxysilane, etc. A mixture including one or two or more compounds selected from among these compounds may be used, but the present disclosure is not limited thereto.

In a siloxane monomer/oligomer with a cyclosiloxane group, a siloxane group constituting a repeating unit thereof may be substituted with a C1-C20 alkyl group, and preferably, a C1-C10 alkyl group such as a methyl group or an ethyl group. In this case, a polyalkyl cyclosiloxane polymer containing a cyclosiloxane group as a repeating unit may include a polydialkylsiloxane containing silicon atoms, each of which is substituted with two alkyl groups, e.g., polydimethyl siloxane (PDMS)-based cyclosiloxane polymer.

In a non-restrictive embodiment, a cyclosiloxane polymer may be selected from the group consisting of methylhydrocyclosiloxane; hexa-methylcyclotrisiloxane; hexa-ethylcyclotrisiloxane; tetra-, penta-, hexa-, octa-methylcyclotetrasiloxanes; tetra-ethylcyclotetrasiloxane; tetra-octylcyclotetrasiloxane; tetra-, penta-, hexa-, octa- and deca-methylcyclopentasiloxanes; tetra-, penta-, hexa-, octa- and dodeca-methylcyclohexasiloxanes; tetradeca-methylcycloheptasiloxane; hexadeca-methylcyclooctasiloxane; tetraphenylcyclotetrasiloxane; and a combination thereof.

Non-restrictive examples of a monomer with a tetrahedral siloxane group may include tetrakisdimethylsiloxysilane, tetrakisdiphenylsiloxysilane, tetrakisdiethylsiloxysilane, and a mixture thereof.

Furthermore, for example, silsesquioxane (SSQ) which may be synthesized through a reaction of methyltrichlorosiloxane and dimethylchlorosiloxane or the like may be used as a reactive component for synthesizing a siloxane-based polymer, as well as a linear silane, cyclosilane, and tetrahedral siloxane. Silsesquioxane may be synthesized into polysilsesquioxane having a ladder structure or a cage structure through cross linking. For example, a heptamer type siloxane having a partial cage structure, a heptamer type siloxane having a cage structure, and an octamer type siloxane having a cage structure, etc. are obtained through hydrolysis of organotrichlorosilane. A silsesquioxane monomer may be obtained by separating the heptamer type siloxane using a solubility difference and carrying out a condensation reaction of the heptamer type siloxane with organotrialkoxysilane or organotrichlorosilane. Generally, silsesquioxane may have a chemical formula of $RSiO_{3/2}$ (here, R represents hydrogen, a C1 to C10 alkyl group, or a C2 to C10 alkoxy group) but silsesquioxane applicable to the present disclosure is not limited thereto. When a siloxane monomer/oligomer having a silsesquioxane structure is used, it may be preferable to use a silsesquioxane unit structure capable of forming polyhedral oligomeric silsesquioxane (POSS) which has a ladder or cage structure and excellent heat resistance.

A silazane-based polymer may be obtained using ammonia or hexanemethyldisilazane (HDMS) as a nitrogen source and using, as a starting material, a silane halide substituted or unsubstituted with a C1-C10 alkyl group, a C2-C20 alkenyl group, a C3-C20 cycloalkyl group, a C5-C30 aryl group, a C5-C30 heteroaryl group, a C1-C10 arylsilyl group, a C1-C10 alkyl amine group, a C1-C10 alkoxy group, or the like (e.g., chlorosilane). In one embodiment, the silazane-based polymer may be a perhydro silazane-based polymer unsubstituted with a silane moiety.

To form the interface control layer 140, a composition, for forming a liquid binder, which contains a precursor which is a polymeric component of a monomer and/or an oligomer for forming a siloxane-based polymer or a silazane-based polymer, and an organic solvent (and a photopolymerization initiator when needed) may be applied onto an appropriate base material, e.g., on the first charge transfer layer 130, using spin coating, drop coating, dip coating, spray coating, roll coating, slit coating, flow coating, and a solution process, such as a casting process, screen printing, inkjet printing, knife jetting, or dispensing, or a combination thereof, and then heat curing or photocuring such as UV curing may be performed.

For example, heat curing may be carried out using a hot plate and may be carried out for five to twenty minutes at about 80 to 150° C., and preferably, 100 to 150° C. Photocuring may be carried out for several seconds by emitting light with an intensity of about 1000 to 5000 $mJ/cm^2$, and preferably, light with an intensity of 2500 to 4000 $mJ/cm^2$ (using a UV lamp or an LED lamp).

In this case, the content of the polymeric component, i.e., the precursor which is a reactive component, contained in the composition for forming a liquid binder may be about 30 to 70 parts by weight with respect to the total weight of the composition. In the present disclosure, the term "parts by weight" refers to a ratio between weights of components to be mixed unless mentioned otherwise.

The type of the organic solvent contained in the composition for forming a liquid binder is not particularly limited, and may include at least one alcohol-based solvent selected from the group consisting of methanol and ethanol; at least one ether-based solvent selected from the group consisting of tetrahydrofuran, ethyleneglycol monomethylether, ethyleneglycol monoethylether, ethyleneglycol dimethylether, ethyleneglycol diethylether, ethyleneglycol methylethylether, propyleneglycol monomethylether, propyleneglycol monoethylether, propyleneglycol propylether, propyleneglycol butylether, diethyleneglycol monomethylether, diethyleneglycol monoethylether, diethyleneglycol dimethylether, diethyleneglycol diethylether, and diethyleneglycol methylethylether; at least one ester-based solvent selected from the group consisting of ethyleneglycol monoethylester, methyl lactate, ethyl lactate, methyl acetate, ethyl acetate, propyl acetate, 2-hydroxy ethyl propionate, 2-hydroxy-2-methyl methyl propionate, 2-hydroxy-2-methyl ethyl propionate, hydroxy methyl acetate, hydroxy ethyl acetate, propyleneglycol methylethyl propionate, and propyleneglycol ethylether propionate; at least one acetate-based solvent selected from the group consisting of ethyleneglycol monomethylether acetate, ethyleneglycol monoethylether acetate, propyleneglycol monomethylether acetate, and propyleneglycol monoethylether acetate; at least one aromatic hydrocarbon-based solvent selected from the group consisting of toluene, xylene, and cresol; at least one ketone-based solvent selected from the group consisting of acetone, methyl ethyl ketone, cyclopentanone, cyclohexanone, 2-heptanone, and 4-hydroxy-4-methyl-2-pentanone; at least one amide-based solvent selected from the group consisting of N-methylpyrrolidone (NMP), N-methylacetamide, N,N-dimethylacetamide (DMAc), N-methyl formamide, and N,N-dimethyl formamide (DMF); a lactone-based solvent such as γ-butyrolactone; and a combination thereof. The contents of these solvents may be 40 to 100 parts by weight, preferably, 50 to 90 parts by weight, and more preferably, 60 to 80 parts by weight with respect to the total weight of the composition for forming a liquid binder.

When photocuring is required, an acetophenone-based photopolymerization initiator, a benzophenone-based photopolymerization initiator, a thioxanthone-based photopolymerization initiator, a benzoin-based photopolymerization initiator, or a triazine-based photopolymerization initiator may be used as the photopolymerization initiator contained in the composition for forming a liquid binder. The content of the photopolymerization initiator may be about 0.01 to 10 parts by weight with respect to the total weight of the composition for forming a liquid binder.

Nanoclay has a phyllosilicate structure basically including a combination of a tetrahedral silica layer and an octahedral alumina layer, and it has been known that a kaolinite structure is generated through a condensation reaction between —OH functional groups of the two layers. Silicate containing a silica layer and an alumina layer at a ratio of 2:1 may be classified into various structures according to the amount of negative charges therein, unlike kaolinite containing a silica layer and an alumina layer at a ratio of 1:1.

The type of clay of the nanoclay is not particularly limited, and examples of the nanoclay may include kaolinite (containing silica and alumina at a ratio of 1:1), palygorskite (clay consisting of hydrated magnesium silicate (magnesium aluminum silicate), in which silica and alumina are contained at a ratio of 2:1), or smectite-based clay, which is also referred to as bentonite, and a representative example thereof is sodium montmorillonite. Here, tetrahedral silica and octahedral alumina are contained at a ratio of 2:1, in which some alumina is substituted with tetrahedral silica and some iron or magnesium is substituted with octahedral aluminum and thus the amount of cations is small due to substitution with other materials. Thus, monovalent cations are adsorbed onto a surface of the smectite-based clay).

Among these examples, it has been known that a crystal structure of smectite-based montmorillonite is based on a structure of pyrophyllite. In the structure of pyrophyllite, $Mg^{2+}$, $Fe^{2+}$, and $Fe^{3+}$ ions are isomorphously substituted for $Al^{3+}$ ions at an octahedral layer, and $Al^{3+}$ ions are isomorphously substituted for $Si^{4+}$ ions at a tetrahedral layer. Furthermore, for charge balance, positive charges such as $Ca^{2+}$, $Ka^+$, or $Na^+$ are present between silicate layers of natural montmorillonite to achieve an overall electrical balance.

For example, nanoclay may be a phyllosilicate selected from the group consisting of montmorillonite, bentonite, hectorite, saponite, beidellite, nontronite, swelling mica, vermiculite, synthetic mica, kanemite, magadiite, kenyaite, kaolinite, smectite, illite, chlorite, muscovite, pyrophyllite, antigorite, glauconite, vermiculite, sepiolite, imogolite, sobockite, nacrite, anauxite, sericite, ledikite, chrysotile, antigorite, and a combination thereof.

An organic component may be included as a clay component constituting the nanoclay-polymer composite when needed. In this case, the organic component may be quaternary ammonium, phosphonium, a maleate, a succinate, an acrylate, benzylic hydrogens and/or oxazoline.

To control a repulsive force between a hydrophilic surface of nanoclay silicate and a polymer chain which may have a hydrophobic property, when an amphoteric organic compound (consisting of, for example, a cationic head part based on either ammonium or onium containing phosphorus (P) or sulfur (S), and a tail part including a linear C6 to C18 low-molecular aliphatic hydrocarbon or alicyclic or aliphatic hydrocarbon compound; for example, dodecylamine) is used as an organic modifier for easy permeation of an organic substance between layers of the nanoclay, the cationic head part may cause the exchange of cations in the silicate to reduce a hydrophilic property of the phyllosilicate and the hydrophobic tail part may increase an interaction with the organic component and the distance between layers of the silicate to facilitate permeation of an organic material between the layers of the silicate, thereby forming a composite of the nanoclay and the polymer. Accordingly, the polymer may form a matrix in the whole composite.

For example, the organic modifier of the nanoclay may include a cationic surfactant selected from the group consisting of cetyltrimethylammonium salt, tetra decylamine, hexadecylamine, octadecylamine, dimethyldistearylammonium salt, trimethyltetradecylammonium salt, trimethylhexadecylammonium salt, trimethyloctadecylammonium salt, benzyltrimethylammonium salt, benzyltriethylammonium salt, phenyltrimethylammonium salt, dimethyldioctadecylammonium salt, benzalkonium salt, stearalkonium salt, denatonium salt, cetylpyridinium salt, tetra-n-butylammonium salt, polyquaternium salt, hexylammonium salt, octylammonium salt, octadecylammonium salt, dioctyldiethylammonium salt, dioctadecyldimethylammonium salt, hexylhydroxyethylammonium salt, dodecylhydroxyethyldimethylammonium salt, octadecylhydroxyethyldimethylammonium salt, octylcarboxyethylammonium salt, dodecylcarboxyethyldimethylammonium salt, hexadecylcarboxyethyldimethylammonium salt, octadecylcarboxyethyldimethylammonium salt, dodecylmercaptoethylmethylammonium salt, hexadecylmercaptoethyldimethylammonium salt, tetraethylphosphonium salt, triethylbenzylphosphonium salt, tri-n-butylbenzylphosphonium salt, and a combination thereof and/or an anionic surfactant selected from the group consisting of stearic acid salt, an alkylcarboxylic acid salt, an alkylsulfate, an alkylbenzenesulfate, an alkylphosphate, an alkylpolyoxyethylene sulfate, and a combination thereof.

To form the nanoclay-polymer composite, an in-situ polymerization method of inserting a monomer which is a unit material of a polymer between layers of clay together with a solvent for polymerization and inducing polymerization between the layers of the clay, a solution intercalation method of dispersing a polymer and clay within a solvent and forming a composite, a melt intercalation method of inducing a polymer chain to be pushed between layers of clay in a flow state by shearing force or a turning force, a direct layered silicate method using a sol-gel reaction carried out by mixing a gel type precursor such as silica/magnesium hydroxide/lithium fluoride with a polymer (e.g., poly(vinylpyrrolidone) (PVP), polydimethyldiallylammoniumchloride (PDDA), hydroxypropylmethylcellulose (HPMC), polyacrylonitrile (PACN), or emeraldine salt polyaniline (PANT)), and heating a mixture of the gel type precursor and the polymer to form a layered structure, a dispersion and aggregation method of dispersing unmodified smectite clay into water to increase the distance between layers of the clay and neutralize interlayer attraction of the clay by the water so that the layers of the clay may become independent layers, adding a polymer latex serving as an emulsifier for maintaining particle stability into the clay-dispersed aqueous solution to obtain a precipitate, and collecting and drying the precipitate to form a composite, or the like may be used, but the present disclosure is not limited thereto.

The nanoclay-polymer composite may be classified into an intercalated structure in which a polymer chain is inserted into a space between the layers of the clay according to the distance between the layers of the clay to increase the distance between the layers of the clay, and an exfoliated structure in which the nanoclay loses interlayer regularity in a polymer matrix. The nanoclay-polymer composite having the exfoliated structure may be preferably used.

In one embodiment, a nanoclay-polymer composite for forming the interface control layer 140 may be selected from the group consisting of a nanoclay-nylon composite (e.g., a nanoclay-nylon 6/12/66 composite), a nanoclay-polyolefin composite (e.g., a nanoclay-polypropylene composite), a nanoclay-poly vinyl alcohol composite, a nanoclay-ethylene vinyl acetate (EVA) composite, a nanoclay-acrylonitrile butadiene styrene copolymer (ABS) composite, and a copolymer composite of nanoclay-polymers as described above, but the present disclosure is not limited thereto.

The interface control layer 140 formed of a nanoclay-polymer composite may be manufactured according to a method which will be described below. The interface control layer 140 may be formed by coating a thin-film forming composite which is a mixture of a nanoclay-polymer composite synthesized as described above and an organic solvent onto the first charge transfer layer 130 and drying the thin-film forming composite. The organic solvent used herein may be the same as the organic solvent for forming a binder, which is used to cure a siloxane-based polymer. A method of coating the nanoclay-polymer composite is not limited, and spin coating, drop coating, dip coating, spray coating, roll coating, or flow coating, a solution process, such as a casting process, screen printing or inkjet printing, or a combination thereof may be used. After a solution in which a nanoclay-polymer composite is dispersed is coated onto the first charge transfer layer 130, the solution may be dried at 120° C. or less, e.g., 50 to 80° C. or less, for one to five hours to remove the organic solvent therefrom, so that the interface control layer 140 formed of the nanoclay-polymer composite may be stacked.

In one embodiment, the interface control layer 140 may be stacked to a thickness of 1 to 30 nm, and preferably, a thickness of 1 to 10 nm. When the thickness of the interface control layer 140 is less than the above-described thickness range, it is hard to expect an improvement in interface morphology of the quantum dots 152 and the emissive layer 150. Even when the thickness of the interface control layer 140 exceeds the above-described thickness range, the interface morphology characteristics of the quantum dots 152 and the emissive layer 150 do not increase and a hole injection characteristic from the first charge transfer layer 130 to the luminous material layer 150 may be degraded.

That is, according to the first embodiment of the present disclosure, the interface control layer 140 is located between the luminous material layer 150 and the first charge transfer layer 130 for supplying holes to the luminous material layer 150. Thus, surface morphology characteristics of the quantum dots 152 and luminous material layer 150 adjacent to the interface control layer 140 may be improved to induce the quantum dots 152 to be uniformly arranged in the entire luminous material layer 150 and moisture or oxygen may be blocked from permeating into the luminous material layer 150 to prevent degradation of the quantum dots 152. Accordingly, a driving voltage of the light-emitting diode 100 may be reduced, and luminous efficiency thereof may be improved and prevented from being decreased over time.

Figure 2:
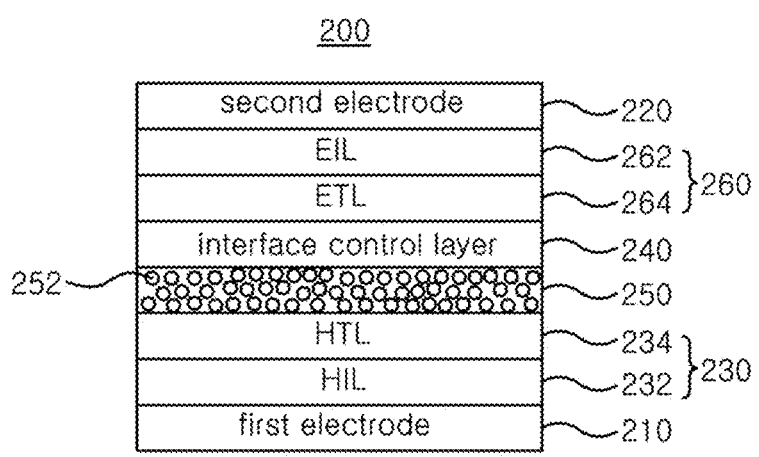
FIG. 2 is a schematic cross-sectional view of a quantum dot light-emitting diode having a normal structure, in which an interface control layer is located between a luminous material layer and a second charge transfer layer, according to a second embodiment of the present disclosure.

FIG. 2 is a schematic cross-sectional view of a quantum dot light-emitting diode having a normal structure in which an interface control layer is located between a luminous material layer and a second charge transfer layer, according to a second embodiment of the present disclosure. As illustrated in FIG. 2, a quantum dot light-emitting diode 200 according to the second embodiment of the present disclosure includes a first electrode 210, a second electrode 220 facing the first electrode 210, a luminous material layer 250 located between the first electrode 210 and the second electrode 220, a first charge transfer layer 230 located between the first electrode 210 and the luminous material layer 250, a second charge transfer layer 260 located between the second electrode 220 and the luminous material layer 250, and an interface control layer 240 located between the luminous material layer 250 and the second charge transfer layer 260.

As in the first embodiment, the first electrode 210 may be an anode, similar to a hole injection electrode. For example, the first electrode 210 may be formed of a doped or undoped metal oxide such as ITO, IZO, ITZO, ICO, $SnO_2$, $In_2O_3$, Cd:ZnO, F:$SnO_2$, In:$SnO_2$, Ga:$SnO_2$ or AZO, or a metal material containing nickel (Ni), platinum (Pt), gold (Au), silver (Ag), iridium (Ir), or carbon nanotubes.

The second electrode 220 may be a cathode, similar to an electron injection electrode. For example, the second electrode 220 may include Ca, Ba, Ca/Al, LiF/Ca, LiF/Al, $BaF_2$/Al, CsF/Al, $CaCO_3$/Al, $BaF_2$/Ca/Al, Al, Mg, Au:Mg, or Ag:Mg. For example, the first electrode 210 and the second electrode 220 may be stacked to a thickness of 50 to 300 nm.

In the present embodiment, the first charge transfer layer 230 may be a hole transfer layer for supplying holes to the luminous material layer 250. For example, the first charge transfer layer 230 may include a HIL 232 located between the first electrode 210 and the luminous material layer 250 and adjacent to the first electrode 210, and an HTL 234 located between the first electrode 210 and the luminous material layer 250 and adjacent to the luminous material layer 250.

The HIL 232 may be formed of a material selected from the group consisting of PEDOT:PSS, TDATA doped with F4-TCNQ, e.g., p-doped phthalocyanine such as ZnPc doped with F4-TCNQ or α-NPD doped with F4-TCNQ, HAT-CN, and a combination thereof, but the present disclosure is not limited thereto. For example, a dopant such as F4-TCNQ may be doped at a ratio of 1 to 20 wt % with respect to a host.

The HTL 234 may be formed of an organic material selected from the group consisting of CBP, aryl amines such as α-NPD(α-NPB), Spiro-NPB, TPD, spiro-TPD, DNTPD, TCTA, m-MTDATA, TFB, and PVK, polyaniline, polypyrrole, copper phthalocyanine, 4,4'-bis(p-carbazolyl)-1,1'-biphenyl, N,N,N',N'-tetraarylbenzidine, PEDOT:PSS and derivatives thereof, poly-N-vinylcarbazole and derivatives thereof, a poly(para)phenylenevinylene such as MEH-PPV or MOMO-PPV, and derivatives thereof, polymethacrylate and derivatives thereof, poly(9,9-octylfluorene) and derivatives thereof, poly(spiro-fluorene) and derivatives thereof, and a combination thereof.

Alternatively, the second charge transfer layer 230 may include one layer. For example, the HIL 232 may be omitted, and the first charge transfer layer 230 may include only the HTL 234. The second charge transfer layer 230 may be formed by doping a hole transport organic material as described above with a hole injection material (e.g., PEDOT:PSS). The HIL 232 and the HTL 234 may each have a thickness of 10 nm to 200 nm, and preferably, a thickness of 10 nm to 100 nm, but the present disclosure is not limited thereto.

The luminous material layer 250 may be a layer filled, for example, with quantum dots 252 having an average diameter of 1 nm to 100 nm. The quantum dots 252 used in the luminous material layer 250 may include a Group II-VI, or III-V nanosemiconductor compound. For example, the quantum dots 252 may be a Cd-free Group or III-V semiconductor compound. The quantum dots 252 may have a single structure or a core/shell structure.

For example, the quantum dots 252 have a core-shell structure in which a luminous core component is located at a center and a surface of the luminous core component is surrounded by a shell to protect the luminous core component. A surface of the shell is surrounded by a ligand component for dispersion in a solvent. Selectively, the quantum dots 252 may be alloy quantum dots (e.g., $CdS_xSe_{1-x}$, $CdSe_xTe_{1-x}$, or $Zn_xCd_{1-x}Se$), such as homogeneous alloy quantum dots or gradient alloy quantum dots.

Light of various wavelengths may be obtained by controlling an energy band gap according to a degree of growth of the quantum dot 252 particles. For example, white color may be realized by including the quantum dots 252 having 440 nm, 530 nm, or 620 nm PL emission characteristics into the luminous material layer 250. Selectively, the luminous material layer 250 may include the quantum dots 252 having a red, green, or blue color, and individually emit red, green, or blue light.

The second charge transfer layer 260 may be an electron transfer layer which supplies electrons to the luminous material layer 250. In one embodiment, the second charge transfer layer 260 includes an EIL 262 located between the second electrode 220 and the luminous material layer 250 and adjacent to the second electrode 220, and an ETL 264 located between the second electrode 220 and the luminous material layer 250 and adjacent to the luminous material layer 250.

The EIL 262 may be formed of a metal material, such as Al, Cd, Cs, Cu, Ga, Ge, In, or Li, which is doped with or bound to fluorine, or a metal oxide doped or undoped with Al, Mg, In, Li, Ga, Cd, Cs, Cu, or the like, e.g., titanium dioxide ($TiO_2$), zinc oxide (ZnO), zirconium oxide (ZrO), tin oxide ($SnO_2$), tungsten oxide ($WO_3$), or tantalum oxide ($Ta_2O_3$).

The ETL 264 may be formed of an oxazole-based compound, an isoxazole-based compound, a triazole-based compound, an isothiazole-based compound, an oxydiazole-based compound, a thiadiazole-based compound, a perylene-based compound, or an aluminum complex. In detail, an organic material of the ETL 264 may be selected from the group consisting of TAZ, BCP, TPBi, $Alq_3$, Balq, Salq, and a combination thereof, but the present disclosure is not limited thereto.

Alternatively, the second charge transfer layer 260 may include only the ETL 264. For example, the EIL 262 and the ETL 264 may be each stacked to a thickness of 10 to 200 nm, and preferably, a thickness of 10 to 100 nm.

According to the second embodiment of the present disclosure, the interface control layer 240 is located between the luminous material layer 250 and the second charge transfer layer 260. The interface control layer 240 may be formed of a material having high interfacial adhesion to the quantum dots 252 of the luminous material layer 250. Furthermore, the interface control layer 240 may be formed of a material having high light transmissivity so as not to decrease optical characteristics and capable of forming a network structure or a layered structure. For example, the interface control layer 240 may be formed of a monomer or an oligomer with a silanol group or a siloxane group, a siloxane-based polymer, a silazane-based polymer and/or a nanoclay-polymer composite.

In one embodiment, when the interface control layer 240 located between the luminous material layer 250 and the second charge transfer layer 260 includes a monomer or an oligomer with a silanol group or a siloxane group, a liquid composition containing the monomer with a silanol group or a siloxane group and an organic solvent may be coated onto the luminous material layer 250 and then a heat drying process may be performed thereon. In this case, when the quantum dots 252 included in the luminous material layer 250 are formed of a cadmium-free based material, the heat drying process may be performed at 80° C. or less, e.g., 50 to 80° C. When the quantum dots 252 are formed of a cadmium-based material, the heat drying process may be performed at 120° C. or less, e.g., 80 to 120° C. For example, the interface control layer 240 may be stacked to a thickness of 1 to 30 nm, and preferably, a thickness of 1 to 10 nm.

That is, according to the second embodiment of the present disclosure, the interface control layer 240 is located between the luminous material layer 250 and the second charge transfer layer 260 which supplies electrons to the luminous material layer 250. By enhancing surface morphology characteristics of the quantum dots 252 and the luminous material layer 250 adjacent to the interface control layer 240, the quantum dots 252 may be induced to be evenly arranged on the entire luminous material layer 250 and moisture or oxygen may be prevented from permeating into the luminous material layer 250 to prevent the quantum dots 252 from being degraded. Thus, a driving voltage of the light-emitting diode 200 may be reduced, and luminous efficiency thereof may be improved and prevented from being decreased over time.

Figure 3:
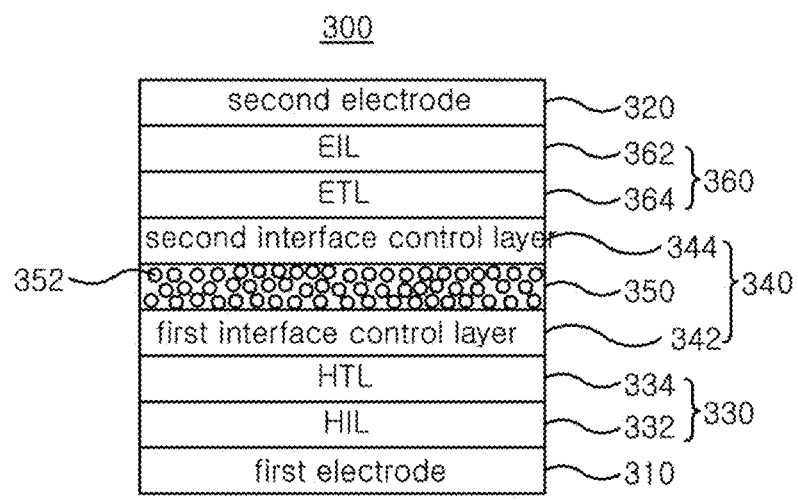
FIG. 3 is a schematic cross-sectional view of a quantum dot light-emitting diode having a normal structure, in which two interface control layers are located between a luminous material layer and a first charge transfer layer and between the luminous material layer and a second charge transfer layer, according to a third embodiment of the present disclosure.

FIG. 3 is a schematic cross-sectional view of a quantum dot light-emitting diode having a normal structure in which two interface control layers are located between a luminous material layer and a first charge transfer layer and between the luminous material layer and a second charge transfer layer, according to a third embodiment of the present disclosure. As illustrated in FIG. 3, a quantum dot light-emitting diode 300 according to the third embodiment of the present disclosure includes a first electrode 310, a second electrode 320 facing the first electrode 310, a luminous material layer 350 located between the first electrode 310 and the second electrode 320, a first charge transfer layer 330 located between the first electrode 310 and the luminous material layer 350, a second charge transfer layer 360 located between the second electrode 320 and the luminous material layer 350, and an interface control layer 340 located between the luminous material layer 350 and the first charge transfer layer 330 and between the luminous material layer 350 and the second charge transfer layer 360.

The first electrode 310 may be an anode, such as a hole injection electrode. For example, the first electrode 310 may be a doped or undoped metal oxide such as ITO, IZO, ITZO, ICO, $SnO_2$, $In_2O_3$, Cd:ZnO, F:$SnO_2$, In:$SnO_2$, Ga:$SnO_2$ or AZO, or a metal material containing nickel (Ni), platinum (Pt), gold (Au), silver (Ag), iridium (Ir), or carbon nanotubes.

The second electrode 320 may be a cathode, similar to an electrode injection electrode. For example, the second electrode 320 may include Ca, Ba, Ca/Al, LiF/Ca, LiF/Al, $BaF_2$/Al, CsF/Al, $CaCO_3$/Al, $BaF_2$/Ca/Al, Al, Mg, Au:Mg, or Ag:Mg. For example, the first electrode 310 and the second electrode 320 may be stacked to a thickness of 50 to 300 nm.

In the present embodiment, the first charge transfer layer 330 may be a hole transfer layer which supplies holes to the luminous material layer 350. In one embodiment, the first charge transfer layer 330 may include an HIL 332 located between the first electrode 310 and the luminous material layer 350 and adjacent to the first electrode 310, and an HTL 334 located between the first electrode 310 and the luminous material layer 350 and adjacent to the luminous material layer 350.

The HIL 332 may be formed of a material selected from the group consisting of PEDOT:PSS, TDATA doped with F4-TCNQ, e.g., p-doped phthalocyanine such as ZnPc doped with F4-TCNQ or α-NPD doped with F4-TCNQ, HAT-CN, and a combination thereof, but the present disclosure is not limited thereto. For example, a dopant such as F4-TCNQ may be doped at a ratio of 1 to 20 wt % with respect to a host.

The HTL 334 may be formed of an organic material selected from the group consisting of aryl amines such as α-NPD(α-NPB), Spiro-NPB, TPD, spiro-TPD, DNTPD, TCTA, m-MTDATA, TFB, and PVK, polyaniline, polypyrrole, copper phthalocyanine, 4,4'-bis(p-carbazolyl)-1,1'-biphenyl, N,N,N',N'-tetraarylbenzidine, PEDOT:PSS and derivatives thereof, poly-N-vinylcarbazole and derivatives thereof, a poly(para)phenylenevinylene such as MEH-PPV or MOMO-PPV, and derivatives thereof, polymethacrylate and derivatives thereof, poly(9,9-octylfluorene) and derivatives thereof, poly(spiro-fluorene) and derivatives thereof, and a combination thereof.

The first charge transfer layer 330 may include one layer. For example, the HIL 332 may be omitted, and the first charge transfer layer 330 may include only the HTL 334. The first charge transfer layer 330 may be formed by doping a hole transport organic material as described above with a hole injection material (e.g., PEDOT:PSS). Each of the HIL 332 and the HTL 334 may have a thickness of 10 nm to 200 nm, and preferably, a thickness of 10 nm to 100 nm, but the present disclosure is not limited thereto.

The luminous material layer 350 may be a layer filled, for example, with quantum dots 352 having an average diameter of 1 nm to 100 nm. The quantum dots 352 used in the luminous material layer 350 may include a Group II-VI, or III-V nanosemiconductor compound. For example, the quantum dots 352 may be a Cd-free Group or III-V semiconductor compound. The quantum dots 352 may have a single structure or a core/shell structure.

For example, the quantum dots 352 have a core-shell structure in which a luminous core component is located at a center and a surface of the luminous core component is surrounded by a shell to protect the luminous core component. A surface of the shell is surrounded by a ligand component for dispersion in a solvent. Selectively, the quantum dots 352 may be alloy quantum dots (e.g., $CdS_xSe_{1-x}$, $CdSe_xTe_{1-x}$, or $Zn_xCd_{1-x}Se$), such as homogeneous alloy quantum dots or gradient alloy quantum dots.

Light of various wavelengths may be obtained by controlling an energy band gap according to a degree of growth of the quantum dot 352 particles. For example, white color may be realized by including the quantum dots 352 having 440 nm, 530 nm, or 620 nm PL emission characteristics into the luminous material layer 350. Selectively, the luminous material layer 350 may include the quantum dots 352 having a red, green, or blue color, and individually emit red, green, or blue light.

The second charge transfer layer 360 may be an electron transfer layer which supplies electrons to the luminous material layer 350. In one embodiment, the second charge transfer layer 360 includes an EIL 362 located between the second electrode 320 and the luminous material layer 350 and adjacent to the second electrode 320, and an ETL 364 located between the second electrode 320 and the luminous material layer 350 and adjacent to the luminous material layer 350.

The EIL 362 may be formed of a metal material, such as Al, Cd, Cs, Cu, Ga, Ge, In, or Li, which is doped with or bound to fluorine, or a metal oxide doped or undoped with Al, Mg, In, Li, Ga, Cd, Cs, or Cu, e.g., titanium dioxide ($TiO_2$), zinc oxide (ZnO), zirconium oxide (ZrO), tin oxide ($SnO_2$), tungsten oxide ($WO_3$), or tantalum oxide ($Ta_2O_3$).

The ETL 364 may be formed of an oxazole-based compound, an isoxazole-based compound, a triazole-based compound, an isothiazole-based compound, an oxydiazole-based compound, a thiadiazole-based compound, a perylene-based compound, or an aluminum complex. In detail, the ETL 364 may be formed of an organic material selected from the group consisting of TAZ, BCP, TPBi, $Alq_3$, Balq, Salq, and a combination thereof, but the present disclosure is not limited thereto.

Alternatively, the second charge transfer layer 360 may include only the ETL 364. For example, each of the EIL 362 and the ETL 364 may be stacked to a thickness of 10 to 200 nm, and preferably, a thickness of 10 to 100 nm.

According to the third embodiment of the present disclosure, the interface control layer 340 divided into two parts is located adjacent to the luminous material layer 350. That is, according to the present embodiment, the interface control layer 340 includes a first interface control layer 342 located between the first charge transfer layer 330 and the luminous material layer 350, and a second interface control layer 344 located between the luminous material layer 350 and the second charge transfer layer 360.

The first interface control layer 342 and the second interface control layer 344 may be formed of a material having high interfacial adhesion to the quantum dots 352 of the luminous material layer 350 adjacent thereto. Furthermore, the first interface control layer 342 and the second interface control layer 344 may be formed of a material having high light transmissivity so as not to decrease optical characteristics and capable of forming a network structure or a layered structure. For example, the first interface control layer 342 and the second interface control layer 344 may be formed of a monomer or an oligomer with a silanol group and/or a siloxane group, a siloxane-based polymer, a silazane-based polymer, and/or a nanoclay-polymer composite.

For example, the first and second interface control layers 342 and 344 may be each stacked to a thickness of 1 to 30 nm, and preferably, a thickness of 1 to 10 nm. The first interface control layer 342 and the second interface control layer 344 may be formed of the same material or different materials.

The first interface control layer 342 and the second interface control layer 344 may be stacked to the same thickness. Alternatively, the first interface control layer 342 and the second interface control layer 344 may be stacked to different thicknesses. Generally, it has been known that an energy barrier for injecting holes is higher than that for injecting electrons in relation to the movement of charges to the luminous material layer 350. Thus, the thickness of the first interface control layer 342 located between the first charge transfer layer 330 which is an HTL and the luminous material layer 350 is preferably equal to or less than that of the second interface control layer 344 located between the second charge transfer layer 360 which is an ETL and the luminous material layer 350. A balance between the amount of holes and the amount of electrons to be injected into the luminous material layer 350 may be induced by stacking the first interface control layer 342 to a thickness less than or equal to that of the second interface control layer 344.

For example, the first interface control layer 342 adjacent to the first charge transfer layer 330 which supplies holes to the luminous material layer 350, and the second interface control layer 344 adjacent to the second charge transfer layer 360 which supplies electrons to the luminous material layer 350 may be stacked at a thickness ratio of 1:1 to 1:5, preferably, a thickness ratio of 1:1 to 1:4, and more preferably, a thickness ratio of 1:2 to 1:4. For example, the first interface control layer 342 may be stacked to a thickness of 1 to 10 nm, and preferably, a thickness of 1 to 3 nm, and the second interface control layer 344 may be stacked to a thickness of 2 to 30 nm, and preferably, a thickness of 5 to 10 nm.

According to the third embodiment of the present disclosure, the first interface control layer 342 located between the luminous material layer 350 and the first charge transfer layer 330 which supplies holes to the luminous material layer 350, and the second interface control layer 344 located between the luminous material layer 350 and the second charge transfer layer 340 which supplies electrons to the luminous material layer 350 are provided. That is, in the present embodiment, the interface control layers 342 and 344 are respectively provided at opposite interfaces of the luminous material layer 350 including the quantum dots 352. When compared to the first and second embodiments in which an interface control layer is formed at only one interface of the luminous material layer 350, surface morphology characteristics of the quantum dots 352 and the luminous material layer 350 may be improved to induce the quantum dots 352 to be uniformly arranged in the luminous material layer 350 and moisture or oxygen may be more effectively blocked from permeating into the luminous material layer 350 to prevent degradation of the quantum dots 352. Accordingly, a driving voltage of the light-emitting diode 300 may be reduced, and luminous efficiency thereof may be improved and prevented from being decreased over time.

A quantum dot light-emitting diode having a normal structure in which a HTL is located between a first electrode having a relatively low work function and a luminous material layer and an ETL is located between a second electrode having a high work function and the luminous material layer has been described above in the first to third embodiments. A quantum dot light-emitting diode may have an inverted structure rather than the normal structure, as will be described below.

Figure 4:
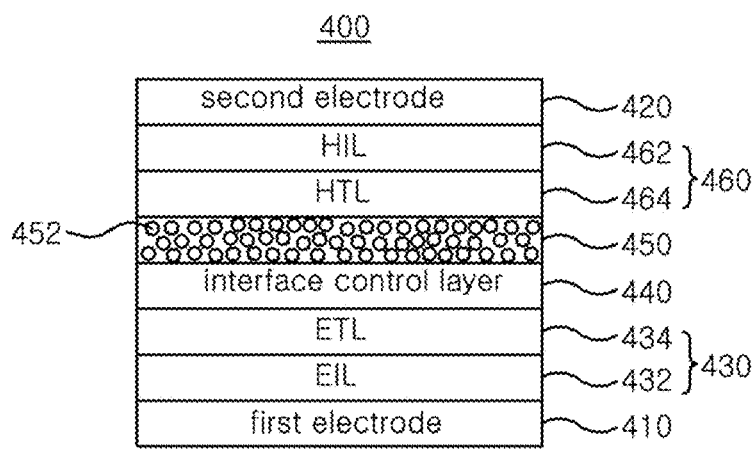
FIG. 4 is a schematic cross-sectional view of a quantum dot light-emitting diode having an inverted structure, in which an interface control layer is located between a luminous material layer and a first charge transfer layer, according to a fourth embodiment of the present disclosure.

FIG. 4 is a schematic cross-sectional view of a quantum dot light-emitting diode having an inverted structure in which an interface control layer is located between a luminous material layer and a first charge transfer layer, according to a fourth embodiment of the present disclosure. As illustrated in FIG. 4, a quantum dot light-emitting diode 400 according to the fourth embodiment of the present disclosure includes a first electrode 410, a second electrode 420 facing the first electrode 410, a luminous material layer 450 located between the first electrode 410 and the second electrode 420, a first charge transfer layer 430 located between the first electrode 410 and the luminous material layer 450, a second charge transfer layer 460 located between the second electrode 420 and the luminous material layer 450, and an interface control layer 440 located between the first charge transfer layer 430 and the luminous material layer 450.

The first electrode 410 may be a cathode, similar to an electrode injection electrode. For example, the first electrode 410 may be formed of a doped or undoped metal oxide such as ITO, IZO, ITZO, ICO, $SnO_2$, $In_2O_3$, Cd:ZnO, F:$SnO_2$, In:$SnO_2$, Ga:$SnO_2$ or AZO, or a metal material including nickel (Ni), platinum (Pt), gold (Au), silver (Ag), iridium (Ir) or carbon nanotubes.

The second electrode 420 may be an anode, similar to a hole injection electrode. For example, the second electrode 420 may include Ca, Ba, Ca/Al, LiF/Ca, LiF/Al, $BaF_2$/Al, CsF/Al, $CaCO_3$/Al, $BaF_2$/Ca/Al, Al, Mg, Au:Mg, or Ag:Mg. For example, the first electrode 410 and the second electrode 420 may be stacked to a thickness of 50 to 300 nm.

The first charge transfer layer 430 may be an electron transfer layer which supplies electrons to the luminous material layer 450. In one embodiment, the first charge transfer layer 430 includes an EIL 432 located between the first electrode 410 and the luminous material layer 450 and adjacent to the first electrode 410, and an ETL 434 located between the first electrode 410 and the luminous material layer 450 and adjacent to the luminous material layer 450.

The EIL 432 may be formed of a metal, such as Al, Cd, Cs, Cu, Ga, Ge, In, or Li, which is doped with or bound to fluorine, or a metal oxide doped or undoped with Al, Mg, In, Li, Ga, Cd, Cs, or Cu, e.g., a titanium dioxide ($TiO_2$), zinc oxide (ZnO), zirconium oxide (ZrO), tin oxide ($SnO_2$), tungsten oxide ($WO_3$), or tantalum oxide ($Ta_2O_3$).

The ETL 434 may be formed of an organic material such as an oxazole-based compound, an isoxazole-based compound, a triazole-based compound, an isothiazole-based compound, an oxydiazole-based compound, a thiadiazole-based compound, a perylene-based compound, or an aluminum complex. In detail, an organic material of the ETL 434 may be selected from the group consisting of TAZ, BCP, TPBi, $Alq_3$, Balq, Salq, and a combination thereof, but the present disclosure is not limited thereto.

Alternatively, the first charge transfer layer 430 may include only one layer, i.e., the ETL 434. For example, the EIL 432 and ETL 434 may be each stacked to a thickness of 10 to 200 nm, and preferably, 10 to 100 nm.

The luminous material layer 450 may be a layer filled with, for example, quantum dots 452 having an average diameter of 1 to 100 nm. The quantum dots 452 used in the luminous material layer 450 may include a Group II-VI, or III-V nano semiconductor compound, and may be, for example, a Cd-free Group or III-V semiconductor compound. The quantum dots 452 may have a single structure or a core/shell structure.

For example, the quantum dots 452 have a core-shell structure in which a luminous core component is located at a center and a surface of the luminous core component is surrounded by a shell to protect the luminous core component. A surface of the shell is surrounded by a ligand component for dispersion in a solvent. Selectively, the quantum dots 452 may be alloy quantum dots (e.g., $CdS_xSe_{1-x}$, $CdSe_xTe_{1-x}$, or $Zn_xCd_{1-x}Se$), such as homogeneous alloy quantum dots or gradient alloy quantum dots.

Light of various wavelengths may be obtained by controlling an energy band gap according to a degree of growth of the quantum dot 452 particles. For example, white color may be realized by including the quantum dots 452 having 440 nm, 530 nm, or 620 nm PL emission characteristics into the luminous material layer 450. Selectively, the luminous material layer 450 may include the quantum dots 452 having a red, green, or blue color, and individually emit red, green, or blue light.

In the present embodiment, the second charge transfer layer 460 may be a hole transfer layer which supplies holes to the luminous material layer 450. In one embodiment, the second charge transfer layer 460 includes a HIL 462 located between the second electrode 420 and the luminous material layer 450 and adjacent to the second electrode 420, and an HTL 464 located between the second electrode 420 and the luminous material layer 450 and adjacent to the luminous material layer 450.

The HIL 462 may be formed of a material selected from the group consisting of PEDOT:PSS, TDATA doped with F4-TCNQ, e.g., p-doped phthalocyanine such as ZnPc doped with F4-TCNQ or α-NPD doped with F4-TCNQ, HAT-CN, and a combination thereof, but the present disclosure is not limited thereto. For example, a dopant such as F4-TCNQ may be doped at a ratio of 1 to 20 wt % with respect to a host.

The HTL 464 may be formed of an organic material. For example, the HTL 464 may be formed of an organic material selected from the group consisting of aryl amines such as α-NPD(α-NPB), Spiro-NPB, TPD, spiro-TPD, DNTPD, TCTA, m-MTDATA, TFB, and PVK, polyaniline, polypyrrole, copper phthalocyanine, 4,4'-bis(p-carbazolyl)-1,1'-biphenyl, N,N,N',N'-tetraarylbenzidine, PEDOT:PSS and derivatives thereof, poly-N-vinylcarbazole and derivatives thereof, a poly(para) phenylenevinylene such as MEH-PPV or MOMO-PPV and derivatives thereof, polymethacrylate and derivatives thereof, poly(9,9-octylfluorene) and derivatives thereof, poly(spiro-fluorene) and derivatives thereof, and a combination thereof.

Alternatively, the second charge transfer layer 460 may include one layer. For example, the HIL 462 may be omitted, and the second charge transfer layer 460 may include only the HTL 464. The HIL 462 may be formed by doping a hole transport organic material as described above with a hole injection material (e.g., PEDOT:PSS). The HIL 462 and the HTL 464 may each have a thickness of 10 nm to 200 nm, and preferably, a thickness of 10 nm to 100 nm, but the present disclosure is not limited thereto.

According the fourth embodiment of the present disclosure, the interface control layer 440 is located between the first charge transfer layer 430 and the luminous material layer 450. The interface control layer 440 may be formed of a monomer or an oligomer with a silanol group and/or a siloxane group, a siloxane-based polymer, a silazane-based polymer and/or a nanoclay-polymer composite. For example, the interface control layer 440 may be sacked to a thickness of 1 to 30 nm, and preferably, a thickness of 1 to 10 nm.

According to the present embodiment, by forming the interface control layer 440 between the first charge transfer layer 430 which is an ETL and the luminous material layer 450, surface morphology characteristics of the quantum dots 452 and the luminous material layer 450 may be improved to induce the quantum dots 452 to be uniformly arranged in the entire luminous material layer 450 and moisture or oxygen may be blocked from permeating into the luminous material layer 450 to prevent degradation of the quantum dots 452. Thus, a driving voltage of the light-emitting diode 400 may be reduced and luminous efficiency thereof may be improved and prevented from being decreased over time.

Figure 5:
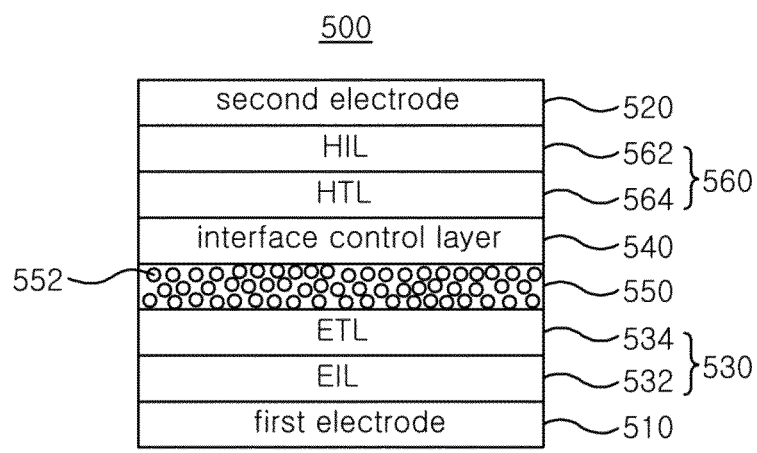
FIG. 5 is a schematic cross-sectional view of a quantum dot light-emitting diode having an inverted structure, in which an interface control layer is located between a luminous material layer and a second charge transfer layer, according to a fifth embodiment of the present disclosure.

FIG. 5 is a schematic cross-sectional view of a quantum dot light-emitting diode having an inverted structure in which an interface control layer is located between a luminous material layer and a second charge transfer layer, according to a fifth embodiment of the present disclosure. As illustrated in FIG. 5, a quantum dot light-emitting diode 500 according to the fifth embodiment of the present disclosure includes a first electrode 510, a second electrode 520 facing the first electrode 510, a luminous material layer 550 located between the first electrode 510 and the second electrode 520, a first charge transfer layer 530 located between the first electrode 510 and the luminous material layer 550, a second charge transfer layer 560 located between the second electrode 520 and the luminous material layer 550, and an the interface control layer 540 located between the luminous material layer 550 and the second charge transfer layer 560.

The first electrode 510 may be a cathode, similar to an electron injection electrode. For example, the first electrode 510 may be formed of a doped or undoped metal oxide, such as ITO, IZO, ITZO, ICO, $SnO_2$, $In_2O_3$, Cd:ZnO, $F:SnO_2$, $In:SnO_2$, $Ga:SnO_2$ or AZO, or a metal material containing nickel (Ni), platinum (Pt), gold (Au), silver (Ag), iridium (Ir) or carbon nanotubes.

The second electrode 520 may be an anode, similar to a hole injection electrode. For example, the second electrode 520 may include Ca, Ba, Ca/Al, LiF/Ca, LiF/Al, $BaF_2$/Al, CsF/Al, $CaCO_3$/Al, $BaF_2$/Ca/Al, Al, Mg, Au:Mg, or Ag:Mg. For example, the first electrode 510 and the second electrode 520 may be stacked to a thickness of 50 to 300 nm.

In the present embodiment, the first charge transfer layer 530 may be an electron transfer layer which supplies electrons to the luminous material layer 550. In one embodiment, the first charge transfer layer 530 may include an EIL 532 located between the first electrode 510 and the luminous material layer 550 and adjacent to the first electrode 510, and an ETL 534 located between the first electrode 510 and the luminous material layer 550 and adjacent to the luminous material layer 550.

The EIL 532 may be a metal which is doped with or bound to fluorine or a metal oxide doped or undoped with a metal. The ETL 534 may be formed of an organic material such as an oxazole-based compound, an isoxazole-based compound, a triazole-based compound, an isothiazole-based compound, an oxydiazole-based compound, a thiadiazole-based compound, a perylene-based compound, or an aluminum complex. Alternatively, the second charge transfer layer 530 may include only one layer, e.g., the ETL 534. For example, the EIL 532 and the ETL 534 may be each stacked to a thickness of 10 to 200 nm, and preferably, a thickness of 10 to 100 nm.

The luminous material layer 550 may be filled with, for example, quantum dots 552 having an average diameter of 1 nm to 100 nm. The quantum dots 552 used in the luminous material layer 550 may include a Group II-VI, or III-V nanosemiconductor compound, and may be, for example, a Cd-free Group or III-V semiconductor compound. The quantum dots 552 may include a single structure of a core/shell structure.

For example, the quantum dots 552 have a core-shell structure in which a luminous core component is located at a center and a surface of the luminous core component is surrounded by a shell to protect the luminous core component. The quantum dots 552 may be alloy quantum dots (e.g., $CdS_xSe_{1-x}$, $CdSe_xTe_{1-x}$, or $Zn_xCd_{1-x}Se$). Light of various wavelengths may be obtained by controlling an energy band gap according to a degree of growth of the quantum dot 552 particles.

In the present embodiment, the second charge transfer layer 560 may be a hole transfer layer which supplies holes to the luminous material layer 550. In one embodiment, the second charge transfer layer 560 may include a HIL 562 located between the second electrode 520 and the luminous material layer 550 and adjacent to the second electrode 520, and an HTL 564 located between the second electrode 520 and the luminous material layer 550 and adjacent to the luminous material layer 550.

The HIL 562 may be formed of a material selected from the group consisting of PEDOT:PSS, TDATA doped with F4-TCNQ, e.g., p-doped phthalocyanine such as ZnPc doped with F4-TCNQ or α-NPD doped with F4-TCNQ, HAT-CN, and a combination thereof.

The HTL 564 may be formed of an organic material selected from the group consisting of aryl amines such as α-NPD(α-NPB), Spiro-NPB, TPD, spiro-TPD, DNTPD, TCTA, m-MTDATA, TFB, and PVK, polyaniline, polypyrrole, copper phthalocyanine, 4,4'-bis(p-carbazolyl)-1,1'-biphenyl, N,N,N',N'-tetraarylbenzidine, PEDOT:PSS and derivatives thereof, poly-N-vinylcarbazole and derivatives thereof, a poly(para)phenylenevinylene such as MEH-PPV or MOMO-PPV, and derivatives thereof, polymethacrylate and derivatives thereof, poly(9,9-octylfluorene) and derivatives thereof, poly(spiro-fluorene) and derivatives thereof, and a combination thereof.

The second charge transfer layer 560 may include one layer. The HIL 562 and the HTL 564 may each have a thickness of 10 nm to 200 nm, and preferably, a thickness of 10 nm to 100 nm, but the present disclosure is not limited thereto.

According to the fifth embodiment of the present disclosure, the interface control layer 540 is located between the luminous material layer 550 and the second charge transfer layer 560 which may be a hole transfer layer. The interface control layer 540 may be formed of a monomer or an oligomer with a silanol group and/or a siloxane group, a siloxane-based polymer, a silazane-based polymer and/or a nanoclay-polymer composite. For example, the interface control layer 540 may be stacked to a thickness of 1 to 30 nm, and preferably, a thickness of 1 to 10 nm.

According to the present embodiment, by forming the interface control layer 540 between the luminous material layer 550 and the second charge transfer layer 560, surface morphology characteristics of the quantum dots 552 and the luminous material layer 550 may be improved to induce the quantum dots 552 to be uniformly arranged in the entire luminous material layer 550 and moisture or oxygen may be blocked from permeating into the luminous material layer 250 to prevent degradation of the quantum dots 552. Therefore, a driving voltage of the light-emitting diode 500 may be reduced, and luminous efficiency thereof may be improved and prevented from being decreased over time.

Figure 6:
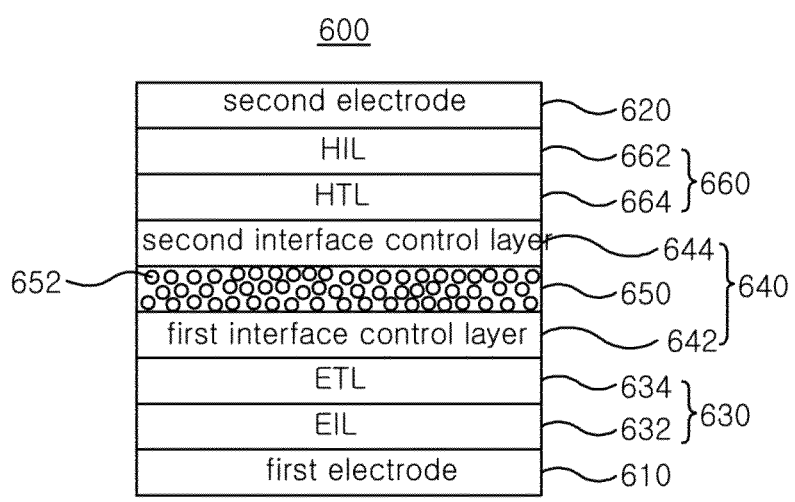
FIG. 6 is a schematic cross-sectional view of a quantum dot light-emitting diode having an inverted structure, in which two interface control layers are located between a luminous material layer and a first charge transfer layer and between the luminous material layer and a second charge transfer layer, according to a sixth embodiment of the present disclosure.

FIG. 6 is a schematic cross-sectional view of a quantum dot light-emitting diode having an inverted structure in which two interface control layers are located between a luminous material layer and a first charge transfer layer and between the luminous material layer and a second charge transfer layer, according to a sixth embodiment of the present disclosure.

As illustrated in FIG. 6, a quantum dot light-emitting diode 600 according to the sixth embodiment of the present disclosure includes a first electrode 610, a second electrode 620 facing the first electrode 610, a luminous material layer 650 located between the first electrode 610 and the second electrode 620, a first charge transfer layer 630 located between the first electrode 610 and the luminous material layer 650, a second charge transfer layer 660 located between the second electrode 620 and the luminous material layer 650, and an interface control layer 640 located between the luminous material layer 650 and the first charge transfer layer 630 and between the luminous material layer 650 and the second charge transfer layer 660.

The first electrode 610 may be a cathode, similar to an electron injection electrode. For example, the first electrode 610 may be formed of a doped or undoped metal oxide such as ITO, IZO, ITZO, ICO, $SnO_2$, $In_2O_3$, Cd:ZnO, $F:SnO_2$, $In:SnO_2$, $Ga:SnO_2$, or AZO, or a metal material containing nickel (Ni), platinum (Pt), gold (Au), silver (Ag), iridium (Ir), or carbon nanotubes.

The second electrode 620 may be an anode, similar to a hole injection electrode. For example, the second electrode 620 may include Ca, Ba, Ca/Al, LiF/Ca, LiF/Al, $BaF_2/Al$, CsF/Al, $CaCO_3/Al$, $BaF_2/Ca/Al$, Al, Mg, Au:Mg, or Ag:Mg. For example, the first electrode 610 and the second electrode 620 may be stacked to a thickness of 50 to 300 nm.

In the present embodiment, the first charge transfer layer 630 may be an electron transfer layer which supplies electrons to the luminous material layer 650. In one embodiment, the first charge transfer layer 630 includes an EIL 632 located between the first electrode 610 and the luminous material layer 650 and adjacent to the first electrode 610, and an ETL 634 located between the first electrode 610 and the luminous material layer 650 and adjacent to the luminous material layer 650.

The EIL 632 may be formed of a metal which is doped with or bound to fluorine, or a metal oxide doped or undoped with a metal. The ETL 634 may be formed of an organic material such as an oxazole-based compound, an isoxazole-based compound, a triazole-based compound, an isothiazole-based compound, an oxydiazole-based compound, a thiadiazole-based compound, a perylene-based compound, or an aluminum complex. In detail, the ETL 634 may be formed of an organic material selected from the group consisting of TAZ, BCP, TPBi, $Alq_3$, Balq, Salq, and a combination thereof. The second charge transfer layer 630 may consist of only one layer, i.e., the ETL 634. For example, the EIL 632 and the ETL 634 may be each stacked to a thickness of 10 to 200 nm, and preferably, a thickness of 10 to 100 nm.

The luminous material layer 650 may be a layer filled with, for example, quantum dots 652 having an average diameter of 1 nm to 100 nm. The quantum dots 652 used in the luminous material layer 650 may include a Group II-VI, or III-V nanosemiconductor compound, and may be, for example, a Cd-free Group or III-V semiconductor compound. The quantum dots 652 may have a single structure or a core/shell structure.

For example, the quantum dots 652 may have a core-shell structure in which a luminous core component is located at a center and a surface of the luminous core component is surrounded by a shell to protect the luminous core component. The quantum dots 652 may be alloy quantum dots (e.g., $CdS_xSe_{1-x}$, $CdSe_xTe_{1-x}$, or $Zn_xCd_{1-x}Se$). Light of various wavelengths may be obtained by controlling an energy band gap according to a degree of growth of the quantum dot 652 particles.

In the present embodiment, the second charge transfer layer 660 may be a hole transfer layer which supplies holes to the luminous material layer 650. In one embodiment, the second charge transfer layer 660 includes a HIL 662 located between the second electrode 620 and the luminous material layer 650 and adjacent to the second electrode 620, and an HTL 664 located between the second electrode 620 and the luminous material layer 650 and adjacent to the luminous material layer 650.

The HIL 662 may be formed of a material selected from the group consisting of PEDOT:PSS, TDATA doped with F4-TCNQ, e.g., p-doped phthalocyanine such as ZnPc doped with F4-TCNQ or α-NPD doped with F4-TCNQ, HAT-CN, and a combination thereof.

The HTL 664 may be formed of an organic material selected from the group consisting of aryl amines such as α-NPD(α-NPB), Spiro-NPB, TPD, spiro-TPD, DNTPD, TCTA, m-MTDATA, TFB, and PVK, polyaniline, polypyrrole, copper phthalocyanine, 4,4'-bis(p-carbazolyl)-1,1'-biphenyl, N,N,N',N'-tetraarylbenzidine, PEDOT:PSS and derivatives thereof, poly-N-vinylcarbazole and derivatives thereof, a poly(para)phenylenevinylene such as MEH-PPV or MOMO-PPV, and derivatives thereof, polymethacrylate and derivatives thereof, poly(9,9-octylfluorene) and derivatives thereof, poly(spiro-fluorene) and derivatives thereof, and a combination thereof.

The second charge transfer layer 660 may include one layer. The HIL 662 and the HTL 664 may each have a thickness of 10 nm to 200 nm, and preferably, a thickness of 10 nm to 100 nm, but the present disclosure is not limited thereto.

According to the sixth embodiment of the present disclosure, the interface control layer 640 divided into two parts is located adjacent to the luminous material layer 650. That is, according to the present embodiment, the interface control layer 640 includes a first interface control layer 642 located between the first charge transfer layer 630 and the luminous material layer 650, and a second interface control layer 644 located between the luminous material layer 650 and the second charge transfer layer 660.

The first interface control layer 642 and the second interface control layer 644 may be formed of a material having high interfacial adhesion to the quantum dots 652 of the luminous material layer 650 adjacent thereto. Furthermore, the first interface control layer 642 and second interface control layer 644 may be formed of a material having high light transmissivity so as not to decrease optical characteristics and capable of forming a network structure or a layered structure. For example, the first interface control layer 642 and the second interface control layer 644 may be formed of a monomer or an oligomer with a silanol group or a siloxane group, a siloxane-based polymer, a silazane-based polymer and/or a nanoclay-polymer composite. For example, the first and second interface control layers 642 and 644 may be each stacked to a thickness of 1 to 30 nm, and preferably, a thickness of 1 to 10 nm. The first interface control layer 642 and the second interface control layer 644 may be formed of the same material or different materials.

The first interface control layer 642 and the second interface control layer 644 may be stacked at the same weight ratio. Alternatively, the first interface control layer 642 and the second interface control layer 644 may be stacked to different thicknesses. As described above, an energy barrier for injecting holes into the luminous material layer 650 is greater than that for injecting electrons into the luminous material layer 650. Thus, the thickness of the second interface control layer 644 located between the second charge transfer layer 660 which is a hole transfer layer and the luminous material layer 650 is preferably equal to or less than that of the first interface control layer 642 located between the first charge transfer layer 630 which is an electron transfer layer and the luminous material layer 650. A balance between the amount of holes and the amount of electrons to be injected into the luminous material layer 650 may be induced by stacking the second interface control layer 644 to a thickness equal to or less than that of the first interface control layer 642.

For example, the first interface control layer 642 adjacent to the first charge transfer layer 630 which supplies electrons to the luminous material layer 650 and the second interface control layer 644 adjacent to the second charge transfer layer 660 which supplies holes to the luminous material layer 650 may be stacked at a thickness ratio of 1:1 to 5:1, preferably, a thickness ratio of 1:1 to 4:1, and more preferably, a thickness ratio of 2:1 to 4:1. For example, the first interface control layer 642 may be stacked to a thickness of 2 to 30 nm, and preferably, a thickness of 5 to 10 nm, and the second interface control layer 644 may be stacked to a thickness of 1 to 10 nm, and preferably, a thickness of 1 to 3 nm.

According to the sixth embodiment of the present disclosure, the first interface control layer 642 located between the luminous material layer 650 and the first charge transfer layer 630 which supplies electrons to the luminous material layer 650, and the second interface control layer 644 located between the luminous material layer 650 and the second charge transfer layer 660 which supplies holes to the luminous material layer 650 are provided. That is, in the present embodiment, the interface control layers 642 and 644 are respectively provided at opposite interfaces of the luminous material layer 650 including the quantum dots 652. When compared to the fourth and fifth embodiments in which an interface control layer is formed on only one interface of an luminous material layer, surface morphology characteristics of the quantum dots 652 and the luminous material layer 650 may be improved to induce the quantum dots 652 to be uniformly arranged in the entire luminous material layer 650 and moisture or oxygen may be more effectively blocked from permeating into the luminous material layer 650 to prevent degradation of the quantum dots 652. Thus, a driving voltage of the light-emitting diode 600 may be reduced, and luminous efficiency thereof may be improved and prevented from being decreased over time.

According to the present disclosure, whether a quantum dot light-emitting diode includes an interface control layer may be determined in the following way. For example, the light-emitting diode is cut in a diagonal direction and components at a cut slope thereof may be analyzed. Time-of-Flight Secondary Ion Mass Spectrometry (TOFSIMS) may be used to analyze components, imaging infrared spectroscopy may be used to analyze a chemical structure, and X-ray photoelectron spectroscopy (XPS) may be used to analyze constituent elements.

Selectively, each layer of the light-emitting diode may be analyzed using a transmission electron microscope (TEM), and components of each layer may be analyzed by obtaining a composition map of each layer by performing energy dispersive spectroscopy (EDS) using a scanning transmission electron microscope (STEM). For example, when a layer of the light-emitting diode contains an aluminum oxide deposited by atomic layer deposition (ALD), components of Al, Si, and carbon layers may be detected through STEM analysis and using energy dispersive X-ray spectroscopy. Furthermore, a work function of a material of each layer of the light-emitting diode may be measured using ultraviolet photoelectron spectroscopy (UPS), and XPS analysis may be performed on each layer to analyze elements thereof and the contents of the elements. In addition, each layer may be collected and EDX, an induced coupled plasma spectrometer (ICP) and/or NMR analysis may be additionally used to detect components of each layer.

Figure 7:
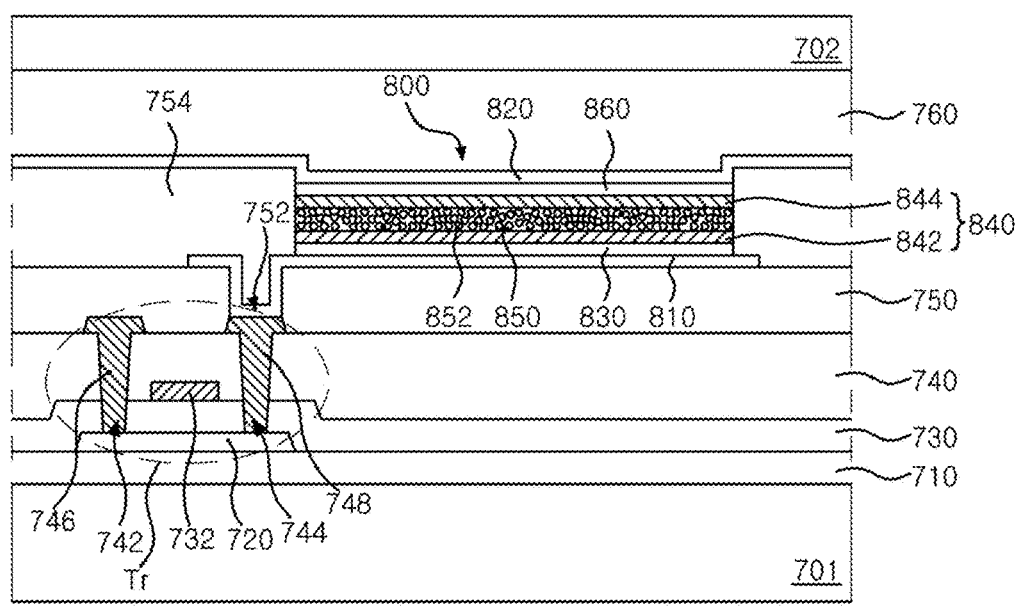
FIG. 7 is a schematic cross-sectional view of a display device to which a quantum dot light-emitting diode according to an embodiment of the present disclosure is applied as a light-emitting device.

Next, a display device to which a quantum dot light-emitting diode according to an embodiment of the present disclosure is applied will be described below. FIG. 7 is a schematic cross-sectional view of a display device to which a quantum dot light-emitting diode according to an embodiment of the present disclosure is applied.

As illustrated in FIG. 7, a quantum dot light-emitting display device 700 includes a driving thin-film transistor Tr which is a driving device, a planarizing layer 750 covering the driving thin-film transistor Tr, and a quantum dot light-emitting diode 800 located on the planarizing layer 750 and connected to the driving thin-film transistor Tr. The driving thin-film transistor Tr includes a semiconductor layer 720, a gate electrode 732, a source electrode 746, and a drain electrode 748. FIG. 7 illustrates a coplanar driving thin-film transistor Tr.

A substrate 701 may be a glass substrate, a thin flexible substrate, or a polymer plastic substrate. For example, the flexible substrate may be formed of polyethersulfone (PES), polyethylenenaphthalate (PEN), polyimide (PI), polyethylene terephthalate (PET), or polycarbonate (PC). The driving thin-film transistor Tr and the quantum dot light-emitting diode 800 formed with a luminous material layer 850 are located on the substrate 701, forming an array substrate.

A buffer layer 710 which may be formed of an inorganic insulating material such as a silicon oxide ($SiO_2$) or a silicon nitride (SiNx) is formed on the entire substrate 701.

The semiconductor layer 720 is formed on a top surface of the buffer layer 710. For example, the semiconductor layer 720 may be formed of an oxide semiconductor material. In this case, a light-shielding pattern (not shown) may be formed between the buffer layer 710 and the semiconductor layer 720. The light-shielding pattern prevents the incidence of light on the semiconductor layer 720 to prevent the semiconductor layer 720 from being degraded due to the light. Alternatively, the semiconductor layer 720 may be formed of polycrystalline silicon. In this case, impurities may be doped into opposite edges of the semiconductor layer 720.

A gate insulating film 730 formed of an insulating material is formed on the entire first substrate 701 to cover the semiconductor layer 720. The gate insulating film 730 may be formed of an inorganic insulating material such as a silicon oxide ($SiO_2$) or a silicon nitride (SiNx).

The gate electrode 732 formed of a conductive material such as a metal is formed on the gate insulating film 730 to correspond to a center of the semiconductor layer 720. Furthermore, a gate line (not shown) and a first capacitor electrode (not shown) may be formed on the gate insulating film 730. The gate line may extend in a first direction and the first capacitor electrode may be connected to the gate electrode 732. Although the gate insulating film 730 is formed on the entire substrate 701, the gate insulating film 730 may be patterned to the same shape as the gate electrode 732.

An interlayer insulating film 740 formed of an insulating material is formed on the entire substrate 701 to cover the gate electrode 732. The interlayer insulating film 740 may be formed of an inorganic insulating material such as a silicon oxide ($SiO_2$) or a silicon nitride (SiNx) or an organic insulating material such as benzocyclobutene or photo-acryl.

The interlayer insulating film 740 includes first and second semiconductor layer contact holes 742 and 744 which expose opposite upper sides of the semiconductor layer 720. The first and second semiconductor layer contact holes 742 and 744 are located at opposite sides of the gate electrode 732 to be spaced apart from the gate electrode 732. Here, the first and second semiconductor layer contact holes 742 and 744 are also formed in the gate insulating film 730, as well as at the opposite sides of the gate electrode 732. In contrast, when the gate insulating film 730 is patterned to the same shape as the gate electrode 732, the first and second semiconductor layer contact holes 742 and 744 are formed only in the interlayer insulating film 740.

The source electrode 746 and the drain electrode 748 formed of a conductive material such as a metal are formed on the interlayer insulating film 740. A data line (not shown), a power source line (not shown), and a second capacitor electrode (not shown) which extend in a second direction may be formed on the interlayer insulating film 740.

The source electrode 746 and the drain electrode 748 are located to be spaced apart from each other while having the gate electrode 732 therebetween, and are in contact with opposite sides of the semiconductor layer 720 via the first and second semiconductor layer contact holes 742 and 744. Although not shown, the data line extends in the second direction and intersects the gate line to define a pixel region, and the power source line through which a high voltage is applied is spaced apart from the data line. The second capacitor electrode is connected to the drain electrode 748 and overlaps the first capacitor electrode to form a storage capacitor using, as a dielectric layer, the interlayer insulating film 740 located between the first and second capacitor electrodes.

The semiconductor layer 720, the gate electrode 732, the source electrode 746, and the drain electrode 748 form the driving thin-film transistor Tr. The driving thin-film transistor Tr of FIG. 7 has a coplanar structure in which the gate electrode 732, the source electrode 746 and the drain electrode 748 are located on the semiconductor layer 720. Alternatively, the driving thin-film transistor Tr may have an inverted staggered structure in which a gate electrode is located below a semiconductor layer and a source electrode and a drain electrode are located on the semiconductor layer. In this case, the semiconductor layer may be formed of amorphous silicon.

Furthermore, a switching thin-film transistor (not shown) having substantially the same structure as the driving thin-film transistor Tr may be formed on the substrate 701. The gate electrode 732 of the driving thin-film transistor Tr is connected to a drain electrode (not shown) of the switching thin-film transistor. The source electrode 746 of the driving thin-film transistor Tr is connected to a power source line (not shown) of the switching thin-film transistor. A gate electrode (not shown) and a source electrode (not shown) of the switching thin-film transistor are respectively connected to the gate line and the data line.

The quantum dot light-emitting display device 700 may include a color filter (not shown) for absorbing light generated by the quantum dot light-emitting diode 800. For example, the color filter may absorb red (R) light, green (G) light, blue (B) light and white (W) light. In this case, red, green, and blue color filter patterns which absorb light may be separately formed in units of pixel regions, and may be arranged to overlap the luminous material layer 850 of the quantum dot light-emitting diode 800 which emits light of a wavelength band to be absorbed. By employing the color filter, the quantum dot light-emitting display device 700 may realize full colors.

For example, when the quantum dot light-emitting display device 700 is of a bottom emission type, the color filter for absorbing light may be located on the interlayer insulating film 740 corresponding to the light-emitting diode 800. In a selective embodiment, when the quantum dot light-emitting display device 700 is of a top emission type, the color filter may be located on the quantum dot light-emitting diode 800, i.e., on the second electrode 820.

The planarizing layer 750 is formed on the source electrode 746 and the drain electrode 748 to cover the entire substrate 701. The planarizing layer 750 has a flat top surface and includes a drain contact hole 752 exposing the drain electrode 748 of the driving thin-film transistor Tr. Here, although it is illustrated that the drain contact hole 752 is formed directly on the second semiconductor layer contact hole 744, it may be formed spaced apart from the second semiconductor layer contact hole 744.

The quantum dot light-emitting diode 800 includes a first electrode 810 located on the planarizing layer 750 and connected to the drain electrode 748 of the driving thin-film transistor Tr, a second electrode 820 facing the first electrode 810, a first charge transfer layer 830, a luminous material layer 850, and a second charge transfer layer 860, which are emission layers located between the first electrode 810 and the second electrode 820. Furthermore, the light-emitting diode 800 includes an interface control layer 840 including a first interface control layer 842 located between the first charge transfer layer 830 and the luminous material layer 850 and a second interface control layer 844 located between the luminous material layer 850 and the second charge transfer layer 860.

In one embodiment, when the quantum dot light-emitting diode 800 has a normal structure, the first electrode 810 is an anode, the second electrode 820 is a cathode, the first charge transfer layer 830 is a hole transfer layer, and the second charge transfer layer 860 is an electron transfer layer. In another embodiment, when the quantum dot light-emitting diode 800 has an inverted structure, the first electrode 810 is a cathode, the second electrode 820 is an anode, the first charge transfer layer 830 is an electron transfer layer, and the second charge transfer layer 860 is a hole transfer layer. Each of the first charge transfer layer 830 and the second charge transfer layer 860 may consist of a single layer or may consist of two or more layers such as a charge injection layer and a charge transport layer.

In this case, when the quantum dot light-emitting display device 700 is a top emission type, a reflective electrode or a reflective layer may be further formed below the first electrode 810. For example, the reflective electrode or the reflective layer may be formed of an aluminum-palladium-copper (APC) alloy.

A bank layer 754 is formed on the planarizing layer 750 to cover edges of the first electrode 810. The bank layer 754 corresponds to a pixel region and exposes a center of the first electrode 810.

An encapsulation film 760 is formed on the second electrode 820 to prevent external moisture or oxygen from permeating into the quantum dot light-emitting diode 800. The encapsulation film 760 may have a stacked structure including a first inorganic insulating layer (not shown), an organic insulating layer (not shown), and a second inorganic insulating layer (not shown) but is not limited thereto.

Although FIG. 7 illustrates that the interface control layer 842 is interposed between the charge transfer layer 830 and the luminous material layer 850 and the interface control layer 844 is interposed between the charge transfer layer 860 and the luminous material layer 850, an interface control layer may be located between the first charge transfer layer 830 and the luminous material layer 850 or between the luminous material layer 850 and the second charge transfer layer 860.

The interface control layer 840 including the first and second interface control layers 842 and 844 may be formed of a monomer or an oligomer including at least one of a silanol group and a siloxane group, a siloxane-based polymer, a silazane-based polymer and/or a nanoclay-polymer composite. For example, the first and second interface control layers 842 and 844 may be each stacked to a thickness of 1 to 30 nm, and preferably, a thickness of 1 to 10 nm.

The interface control layer 840 is located at one or more of between the luminous material layer 850 and the charge transfer layer 830 adjacent to the luminous material layer 850 and between the luminous material layer 850 and the charge transfer layer 860 adjacent to the luminous material layer 850. Surface morphology characteristics of the quantum dots 852 and the luminous material layer 850 adjacent to the interface control layer 840 may be improved to induce the quantum dots 852 to be uniformly arranged in the entire luminous material layer 850 and to prevent permeation of moisture or oxygen into the luminous material layer 850, thereby preventing degradation of the quantum dots 852. Thus, a driving voltage of the light-emitting diode 800 may be decreased and luminous efficiency thereof may be improved and prevented from being decreased over time.

The present disclosure will be described in more detail with respect to examples thereof below, but is not limited thereto.

Example 1: Manufacture of Quantum Dot Light-Emitting Diode Including One Interface Control Layer A glass substrate with an attached ITO electrode (including a reflective plate) having a size of 40 mm×40 mm×0.5 mm was subjected to ultrasonic cleaning for five minutes using isopropyl alcohol, acetone, and DI water and was then dried in a 100° C. oven. After the substrate was cleaned, a plasma treatment was performed on the substrate. A HIL and an HTL were formed by spin-coating PEDOT:PSS as a hole injection material, drying the PEDOT:PSS at 150° C. for thirty minutes, spin-coating poly-TPD and PVK, and drying the poly-TPD and the PVK at 170° C. for thirty minutes. Then, a luminous material layer was formed by spin-coating InP as Cd-free quantum dots and drying the InP at 70° C. for thirty minutes. After the luminous material layer was dried, an interface control layer was formed by spin-coating TEOS and drying the TEOS at 70° C. for thirty minutes. After the spin-coating of the interface control layer was completed, the substrate was moved into a deposition chamber to form an ETL ($Alq_3$), an EIL (LiF), and a cathode (Al) were formed. Thereafter, a resultant structure was encapsulated by glass.

Example 2: Manufacture of Quantum Dot Light-Emitting Diode Including Two Interface Control Layers A glass substrate with an attached ITO electrode (including a reflective plate) having a size of 40 mm×40 mm×0.5 mm was subjected to ultrasonic cleaning for five minutes using isopropyl alcohol, acetone, and DI water and was then dried in a 100° C. oven. After the substrate was cleaned, a plasma treatment was performed on the substrate. A HIL and an HTL were formed by spin-coating PEDOT:PSS as a hole injection material, drying the PEDOT:PSS at 150° C. for thirty minutes, spin-coating poly-TPD and PVK, and drying the poly-TPD and the PVK at 170° C. for thirty minutes. To form a lower interface control layer (a first interface control layer), TEOS was spin-coated and dried at 70° C. for thirty minutes. Then, an emissive layer was formed by spin-coating InP as Cd-free quantum dots and drying the InP at 70° C. for thirty minutes. Next, TEOS was spin-coated and dried at 70° C. for thirty minutes to form an upper interface control layer (a second interface control layer). In this case, a ratio between weights of the TEOS used to form the lower interface control layer and the TEOS used to form the upper interface control layer was controlled to be 1:2 so that a ratio between thicknesses of the lower interface control layer and the upper interface control layer became 1:2. After the spin-coating of the upper interface control layer, the substrate was moved into a deposition chamber to form $Alq_3$, LiF, and Al. Thereafter, a resultant structure was encapsulated with glass.

Example 3: Manufacture of Quantum Dot Light-Emitting Diode Including Two Interface Control Layers A quantum dot light-emitting diode was manufactured in the same way as the process of Example 2, except that a ratio between weights of TEOS used to form a lower interface control layer and TEOS used to form an upper interface control layer was controlled to be 1:1 so that a ratio between thicknesses of the lower interface control layer and the upper interface control layer became 1:1.

Example 4: Manufacture of Quantum Dot Light-Emitting Diode Including Two Interface Control Layers A quantum dot light-emitting diode was manufactured in the same way as the process of Example 2, except that a ratio between weights of TEOS used to form a lower interface control layer and TEOS used to form an upper interface control layer was controlled to be 1:4 so that a ratio between thicknesses of the lower interface control layer and the upper interface control layer became 1:4.

Comparative Example: Manufacture of Quantum Dot Light-Emitting Diode Including No Interface Control Layer A quantum dot light-emitting diode was manufactured in the same way as the process of Example 1, except that an interface control layer was not formed between a luminous material layer and an HTL adjacent to the luminous material layer and between the luminous material layer and an ETL adjacent to the luminous material layer.

Experimental Example 1: Evaluation of Quantum Dot Morphology of Emissive Layer

Figure 8:
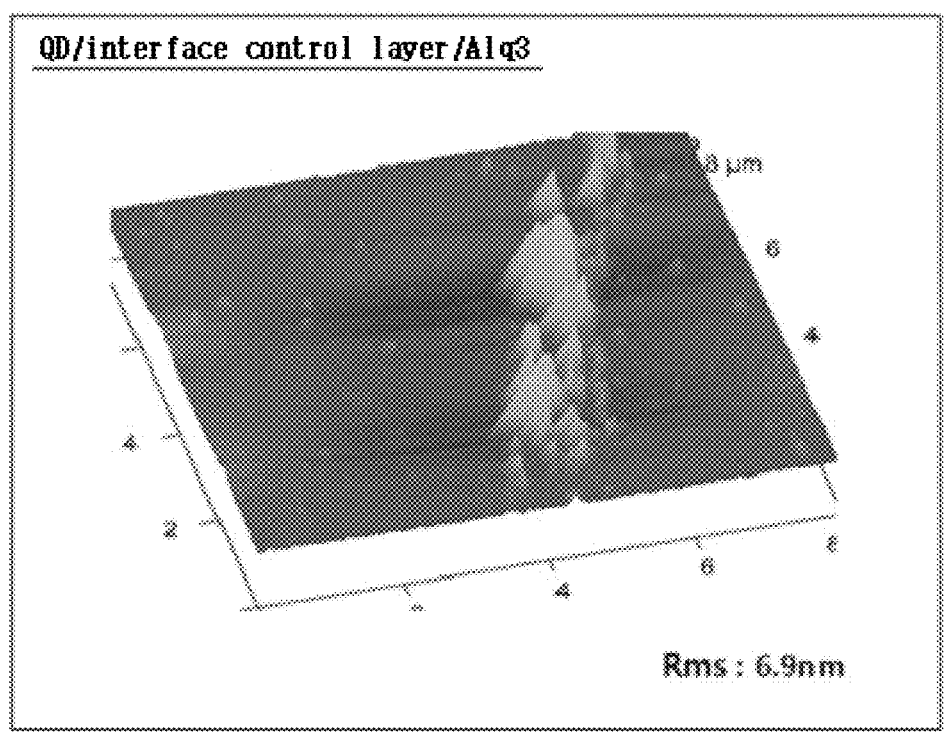
FIG. 8 is a photograph showing a result of evaluating morphology characteristics of quantum dots applied to a luminous material layer of a quantum dot light-emitting diode manufactured according to an embodiment of the present disclosure.
Figure 9:
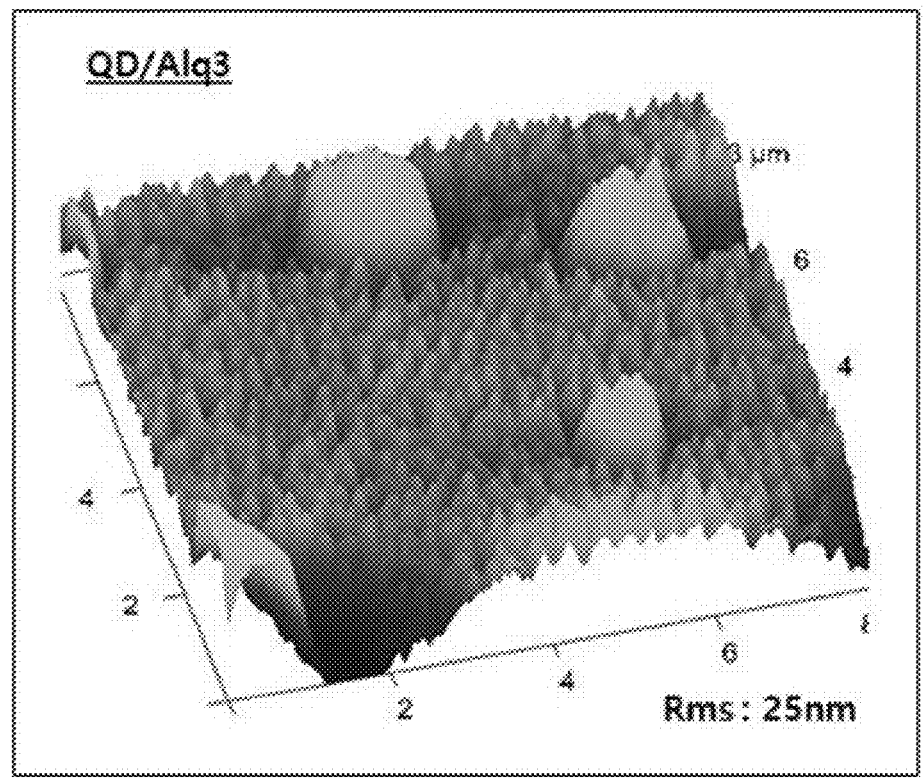
FIG. 9 is a photograph showing a result of evaluating morphology characteristics of quantum dots applied to a luminous material layer of a quantum dot light-emitting diode manufactured according to a comparative example.

Morphology of quantum dots used as an emissive layer in the quantum dot light-emitting diode manufactured according to Example 1 and morphology of quantum dots used as an emissive layer in the quantum dot light-emitting diode manufactured according to the comparative example were evaluated. FIG. 8 is a photograph showing a result of evaluating the morphology of the quantum dots of the quantum dot light-emitting diode manufactured according to Example 1. FIG. 9 is a photograph showing a result of evaluating the morphology of the quantum dots of the quantum dot light-emitting diode manufactured according to the comparative example. In the quantum dot light-emitting diode according to the comparative example including no interface control layer, a root mean square (RMS) of a surface thereof related to surface roughness of a luminous material layer was 25 nm and thus very large. Thus, a rough surface was exhibited, and surface morphology characteristics of the quantum dot light-emitting diode were not uniform. In contrast, in the quantum dot light-emitting diode including an interface control layer according to Example 1, an RMS of a surface thereof a luminous material layer was 6.9 nm. Accordingly, surface morphology characteristics of the quantum dots of the luminous material layer were far better than in the comparative example.

Experimental Example 2: Evaluation of Luminous Characteristics

Luminous characteristics of the quantum dot light-emitting diodes manufactured according to Examples 1 to 4 and the comparative example were evaluated. First, luminous efficiencies of the quantum dot light-emitting diodes manufactured according to Examples 1 to 4 and the comparative example were measured. A result of measuring the luminous efficiencies is shown in Table 1 below. As shown in Table 1, a maximum value of the luminous efficiencies of the light-emitting diodes including the interface control layer stacked adjacent to a luminous material layer according to the present disclosure was 461% higher than that of a light-emitting diode including no interface control layer according to the comparative example. Accordingly, the luminous efficiency of the light-emitting diode according to the present disclosure was greatly improved.

TABLE 1

Luminous efficiencies of the quantum dot light-emitting diodes

| | Luminous efficiency ($cd/m^2$) |
|---|---|
| Example 1 | 366 |
| Example 2 | 421 |
| Example 3 | 332 |
| Example 4 | 372 |
| Comparative example | 75 |

Next, the quantum dot light-emitting diodes manufactured according to Examples 1 and 2 and the comparative example were evaluated in terms of driving voltage, degree of decrease in luminous efficiency over time, and color purity. Evaluation results are shown in Table 2 below and FIG. 10.

TABLE 2

Luminous characteristics of the quantum dot light-emitting diodes

| | Driving voltage (V) | Initial luminous efficiency ($cd/m^2$) | Luminous efficiency ($cd/m^2$) after two days | Luminous efficiency ($cd/m^2$) after four days | CIE |
|---|---|---|---|---|---|
| Example 1 | 6.0 | 366 | 261 (71%*) | 172 (47%*) | (0.631, 0.364) |

TABLE 2-continued

Luminous characteristics of the quantum dot light-emitting diodes

| | Driving voltage (V) | Initial luminous efficiency (cd/m$^2$) | Luminous efficiency (cd/m$^2$) after two days | Luminous efficiency (cd/m$^2$) after four days | CIE |
|---|---|---|---|---|---|
| Example 2 | 6.0 | 421 | 347 (82%*) | 258 (61%*) | (0.632, 0.366) |
| Comparative example | 11.5 | 75 | 44 (59%*) | 19 (25%*) | (0.649, 0.341) |

*when compared to initial luminous efficiency

Figure 10:
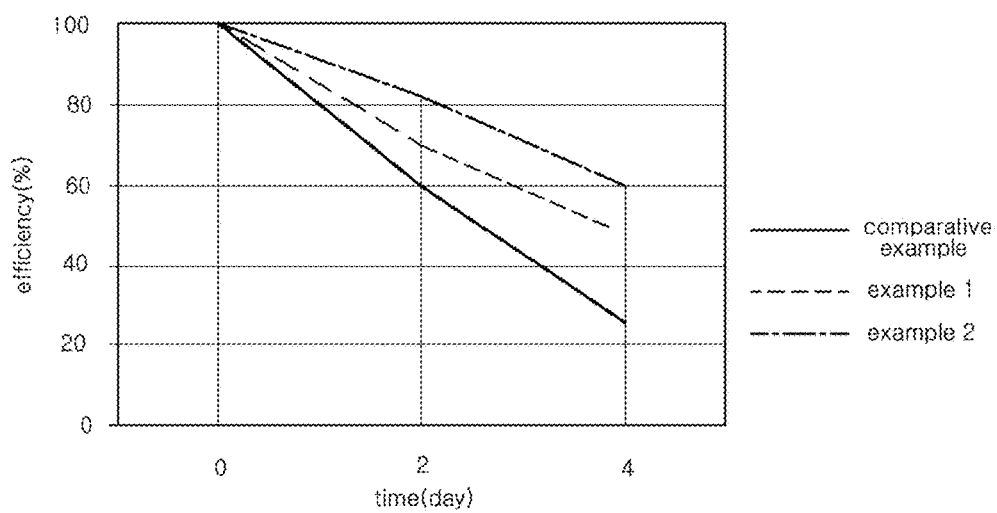
FIG. 10 is a graph showing a result of measuring luminous efficiency of a quantum dot light-emitting diode manufactured according to an embodiment of the present disclosure.

As shown in Table 2 and FIG. 10, when an interface control layer was formed adjacent to a luminous material layer, a driving voltage was reduced by 47.8% and thus a light-emitting diode can be driven even with a low voltage. This result is considered to be due to a decrease in stress with respect to a material of the light-emitting diode and improvement of device lifetime when the interface control layer was formed. In particular, when the interface control layer was not formed according to the comparative example, luminous efficiency was rapidly decreased over time. Thus, the luminous efficiency was only 25% of initial luminous efficiency after four days had elapsed. However, when the interface control layer was formed, a degree of decrease in luminous efficiency was very low even when time elapsed. In particular, when two interface control layers were formed on a top surface and a bottom surface of an emissive layer according to Example 2, 82% of the initial luminous efficiency was maintained even after two days had elapsed and 61% of the initial luminous efficiency was maintained even after four days had elapsed. This result indicates that when the interface control layer was formed, morphology of quantum dots of an emissive layer of a light-emitting diode can be uniformly maintained and moisture or oxygen can be prevented from permeating into the light-emitting diode to prevent degradation of the quantum dots.

The present disclosure suggests a quantum dot light-emitting diode including at least one interface control layer adjacent to a luminous material layer including quantum dots, and a quantum dot light-emitting display device including the same. By forming the at least one interface control layer between the luminous material layer and a charge transfer layer, the occurrence of a defect at an interface between the luminous material layer and the charge transfer layer, caused when the luminous material layer and the charge transfer layer are in direct contact with each other, can be prevented. Thus, morphology characteristics of the luminous material layer can be prevented from being decreased to induce the quantum dots applied to the luminous material layer to have uniform morphology characteristics.

By employing the interface control layer, oxygen and/or moisture may be prevented from permeating into the light-emitting diode and thus the quantum dots which are a luminous material may be prevented from being degraded due to oxygen or moisture and luminous efficiency may be prevented from being decreased due to the degradation of the luminous material.

Accordingly, a quantum dot light-emitting diode employing an interface control layer according to the present disclosure can be driven even with a lower voltage than a quantum dot light-emitting diode which does not use the interface control layer, and luminous efficiency thereof can be greatly improved.

It will be apparent to those skilled in the art that various modifications and variations can be made in the quantum dot light-emitting diode and light-emitting display device using the diode of the present disclosure without departing from the technical idea or scope of the disclosure. Thus, it is intended that the present disclosure cover the modifications and variations of this disclosure provided they come within the scope of the appended claims and their equivalents.

What is claimed is:

1. A quantum dot light-emitting diode, comprising:
   a first electrode;
   a second electrode facing the first electrode;
   a luminous material layer located between the first electrode and the second electrode, the luminous material layer including quantum dots;
   a first charge transfer layer located between the first electrode and the luminous material layer;
   a second charge transfer layer located between the second electrode and the luminous material layer; and
   an interface control layer located between the first charge transfer layer and the luminous material layer and/or between the second charge transfer layer and the luminous material layer,
   wherein the interface control layer is formed of a material selected from the group consisting of a monomer or an oligomer with at least one of a silanol group and a siloxane group, a siloxane-based polymer, a silazane-based polymer, a nanoclay-polymer composite, and a combination thereof.

2. The quantum dot light-emitting diode of claim 1, wherein the interface control layer comprises:
   a first interface control layer located between the first charge transfer layer and the luminous material layer; and
   a second interface control layer located between the second charge transfer layer and the luminous material layer.

3. The quantum dot light-emitting diode of claim 2, wherein the first interface control layer and the second interface control layer are formed of the same material.

4. The quantum dot light-emitting diode of claim 2, wherein the first charge transfer layer comprises a hole transfer layer,
   the second charge transfer layer comprises an electron transfer layer, and
   the first interface control layer and the second interface control layer are stacked at a thickness ratio of 1:1 to 1:5.

5. The quantum dot light-emitting diode of claim 4, wherein the first interface control layer and the second interface control layer are stacked at a thickness ratio of 1:2 to 1:4.

6. The quantum dot light-emitting diode of claim 4, wherein the first interface control layer is stacked to a thickness of 1 to 10 nm, and the second interface control layer is stacked to a thickness of 2 to 30 nm.

7. The quantum dot light-emitting diode of claim 2, wherein the first charge transfer layer comprises an electron transfer layer,
   the second charge transfer layer comprises a hole transfer layer, and
   the first interface control layer and the second interface control layer are stacked at a thickness ratio of 1:1 to 5:1.

8. The quantum dot light-emitting diode of claim 1, wherein the first electrode comprises an anode, the second electrode comprises a cathode, the first charge transfer layer comprises a hole transfer layer, and the second charge transfer layer comprises an electron transfer layer.

9. The quantum dot light-emitting diode of claim 1, wherein the first electrode comprises a cathode, the second electrode comprises an anode, the first charge transfer layer comprises an electron transfer layer, and the second charge transfer layer comprises a hole transfer layer.

10. A quantum dot light-emitting display device, comprising:

a substrate;

the quantum dot light-emitting diode of claim 1, the quantum dot light-emitting diode being located on the substrate; and a driving device located between the substrate and the quantum dot light-emitting diode and connected to the quantum dot light-emitting diode.

* * * * *